US009129701B2

(12) United States Patent
Patel et al.

(10) Patent No.: US 9,129,701 B2
(45) Date of Patent: Sep. 8, 2015

(54) ASYMMETRIC STATE DETECTION FOR NON-VOLATILE STORAGE

(71) Applicant: SanDisk Technologies Inc., Plano, TX (US)

(72) Inventors: Rohan Patel, Fremont, CA (US); Eugene Tam, Saratoga, CA (US); Pao-Ling Koh, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 33 days.

(21) Appl. No.: 14/134,893

(22) Filed: Dec. 19, 2013

(65) Prior Publication Data
US 2015/0179275 A1 Jun. 25, 2015

(51) Int. Cl.
G11C 16/06 (2006.01)
G11C 16/34 (2006.01)
G11C 16/10 (2006.01)
G11C 16/26 (2006.01)

(52) U.S. Cl.
CPC ............ G11C 16/3459 (2013.01); G11C 16/10 (2013.01); G11C 16/26 (2013.01)

(58) Field of Classification Search
USPC ........................... 365/185.17, 185.21, 185.28
See application file for complete search history.

(56) References Cited

U.S. PATENT DOCUMENTS

| 7,734,861 | B2 | 6/2010 | Li et al. |
|---|---|---|---|
| 7,885,112 | B2 | 2/2011 | Li et al. |
| 8,145,855 | B2 | 3/2012 | Wan et al. |
| 8,305,807 | B2 | 11/2012 | Shah et al. |
| 8,379,454 | B2 | 2/2013 | Kochar et al. |
| 8,400,854 | B2 | 3/2013 | Pei et al. |
| 8,429,330 | B2 | 4/2013 | Wan et al. |
| 2004/0255090 | A1 | 12/2004 | Guterman et al. |
| 2008/0151618 | A1 | 6/2008 | Sharon et al. |
| 2009/0067244 | A1 | 3/2009 | Li et al. |
| 2009/0285023 | A1 | 11/2009 | Cho et al. |
| 2009/0296466 | A1 | 12/2009 | Kim et al. |
| 2011/0119432 | A1 | 5/2011 | Yoon |
| 2012/0297111 | A1 | 11/2012 | Hsu et al. |
| 2013/0024605 | A1 | 1/2013 | Sharon et al. |

(Continued)

OTHER PUBLICATIONS

Hu, Yu-Peng et al., "An elastic error correction code technique for NAND flash-based consumer electronic devices," IEEE Transactions on Consumer Electronics, IEEE Service Center, New York, US, vol. 59, No. 1, Feb. 1, 2013, pp. 1-8.

(Continued)

Primary Examiner — Hoai V Ho
(74) Attorney, Agent, or Firm — Vierra Magen Marcus LLP

(57) ABSTRACT

Techniques are disclosed herein for determining whether there is a defect that occurred as a result of programming non-volatile storage elements. Example defects include: broken word lines, control gate to substrate shorts, word line to word line shorts, double writes, etc. The memory cells may be programmed such that there will be a substantially even distribution of the memory cells in different data states. After programming, the memory cells are sensed at one or more reference levels. Two sub-groups of memory cells are strategically formed based on the sensing to enable detection of defects in a simple and efficient manner. The sub-groups may have a certain degree of separation of the data states to avoid missing a defect. The number of memory cells in one sub-group is compared with the other. If there is a significant imbalance between the two sub-groups, then a defect is detected.

20 Claims, 17 Drawing Sheets

(56) References Cited

U.S. PATENT DOCUMENTS

2013/0114344 A1* 5/2013 Sakai et al. ............. 365/185.18
2013/0148425 A1   6/2013 Dutta et al.
2013/0229868 A1   9/2013 Koh et al.

OTHER PUBLICATIONS

International Search Report & The Written Opinion of the International Searching Authority dated Mar. 4, 2015, International Application No. PCT/US2014/068717.

* cited by examiner

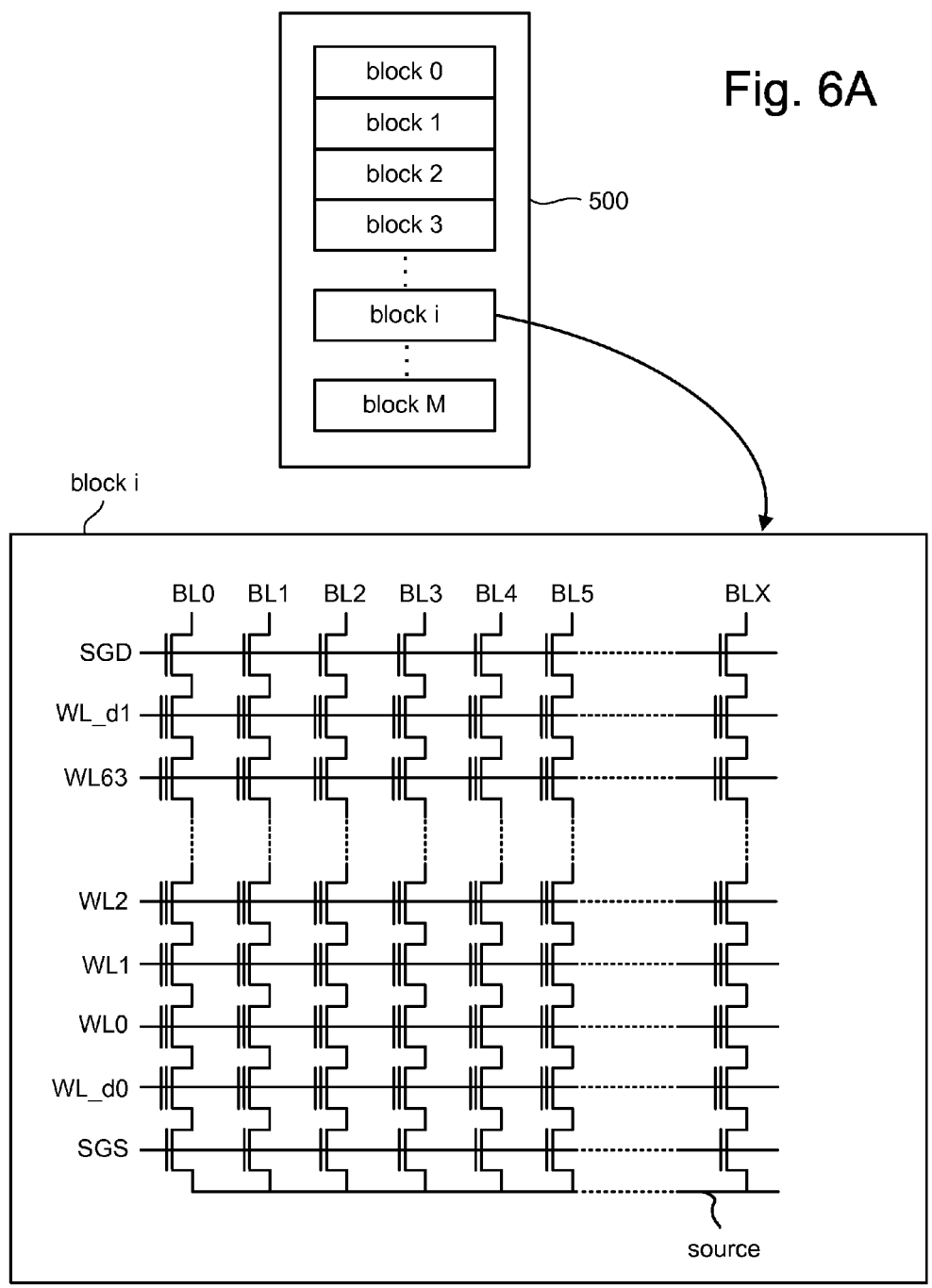

ASYMMETRIC STATE DETECTION FOR NON-VOLATILE STORAGE

BACKGROUND

The present disclosure relates to technology for non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state.

However, one issue which continues to be problematic is memory device reliability.

BRIEF DESCRIPTION OF THE DRAWINGS

FIG. 6A depicts an exemplary structure of memory cell array.

DETAILED DESCRIPTION

Figure 1:
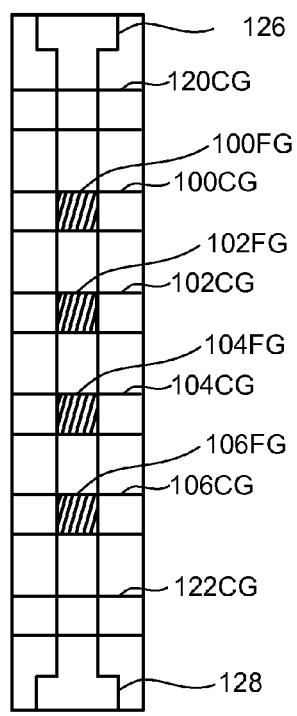
FIG. 1 is a top view of a NAND string.

Techniques are disclosed herein for determining that there is a defect that occurred as a result of programming non-volatile storage elements. The defect is not limited to any particular defect. Examples of defects includes, but are not limited to, broken word lines, control gate to substrate shorts, word line to word line shorts, double writes, etc. Detecting these and other defects presents many challenges. One challenge is to detect a defect while not increasing the programming time too much. Some conventional techniques may require that a large number of sensing operations are performed, which increases the total programming time. Another challenge is that some types of defects can be missed by some conventional techniques. Still another challenge is that there is typically a limited amount of logic (such as latches) on the memory device. It can be challenging to detect defects with a limited amount of logic.

In one embodiment, the memory cells are programmed in such a way that, if the programming is successful, there will be a substantially even distribution of the memory cells in different data states. For example, when programming two bits per memory cell, there would be about 25% of the memory cells in each of four data states. One way to achieve this substantially even distribution is to randomize the data prior to programming. However, other techniques could be used.

After programming is complete (with a result of success or failure), the memory cells are sensed at one or more reference levels. Two sub-groups of memory cells are strategically formed to enable detection of defects in a simple and efficient manner. The two sub-groups may represent all of the data states—with half of the data states represented in each sub-group. The number of memory cells in one sub-group is compared with the other. It is expected that there should be about the same number in each sub-group. If there is not, then a defect is detected.

The comparison of the two groups can be performed very efficiently. Although a variety of techniques could be used, in one embodiment, a running total is kept in an accumulation register of the imbalance of the number of memory cells in the sub-groups. This total could be tracked by logical circuitry on a memory die. In one embodiment, the process includes multiple passes, where different sub-groups are processed with each pass. Using multiple passes can help detect a problem sooner, and also provides for testing various combinations of sub-groups.

In one embodiment, parallel processing is performed to help speed the detection process. For example, forming the sub-groups may involve combining results of sensing operations. A sensing operation can be performed in parallel with combining the results of earlier sensing operations.

Also, the formation of the sub-groups can be strategic to prevent masking of defects. In one embodiment, the sub-groups are formed such that there is a some degree of separation of the data states. As one example, at least one of the sub-groups includes two data states that are separated by a data state in the other sub-group. As another example, there are no adjacent data states in either the first sub-group or in the second sub-group.

Figure 2:
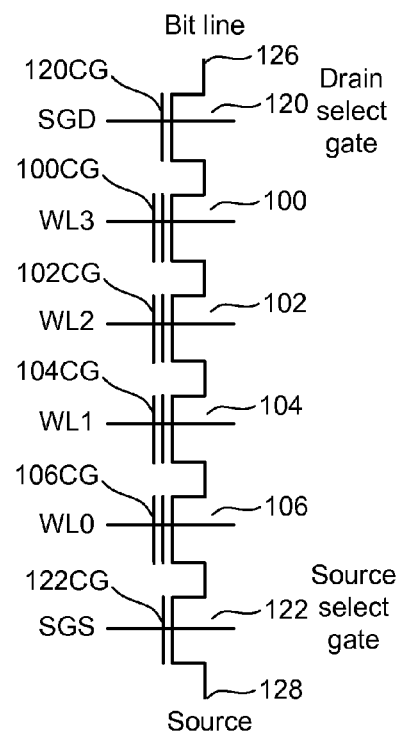
FIG. 2 is an equivalent circuit diagram of the NAND string of FIG. 1.

One example of a memory system suitable for implementing the present invention uses the NAND flash memory structure, which includes arranging multiple transistors in series between two select gates. Note that techniques for defect detect are not limited to NAND architectures. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. The control gates can also be provided as portions of the word lines. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD (drain select gate). Select gate 122 is connected to select line SGS (source select gate).

Figure 3:
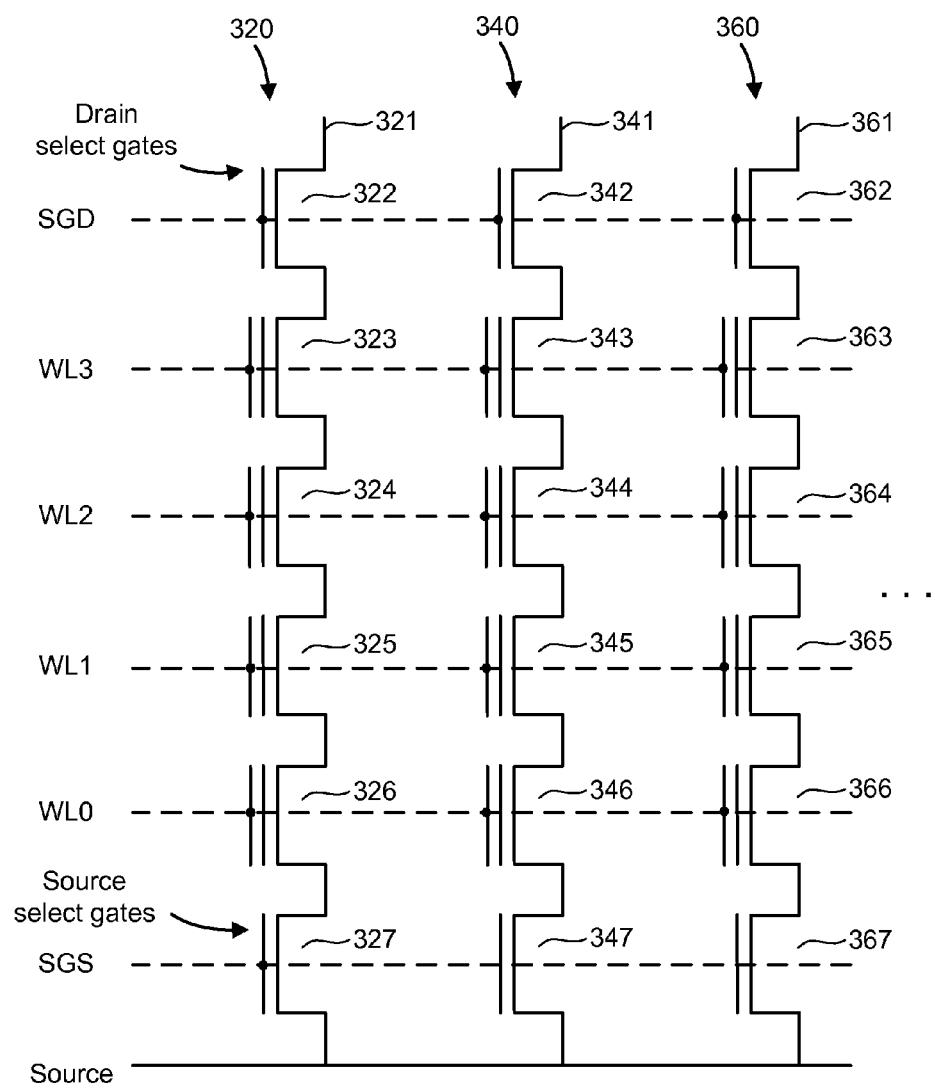
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Pat. No. 7,237,074, both of which are incorporated herein by reference in their entirety, describe various data encoding schemes for multi-state flash storage elements.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

Figure 4:
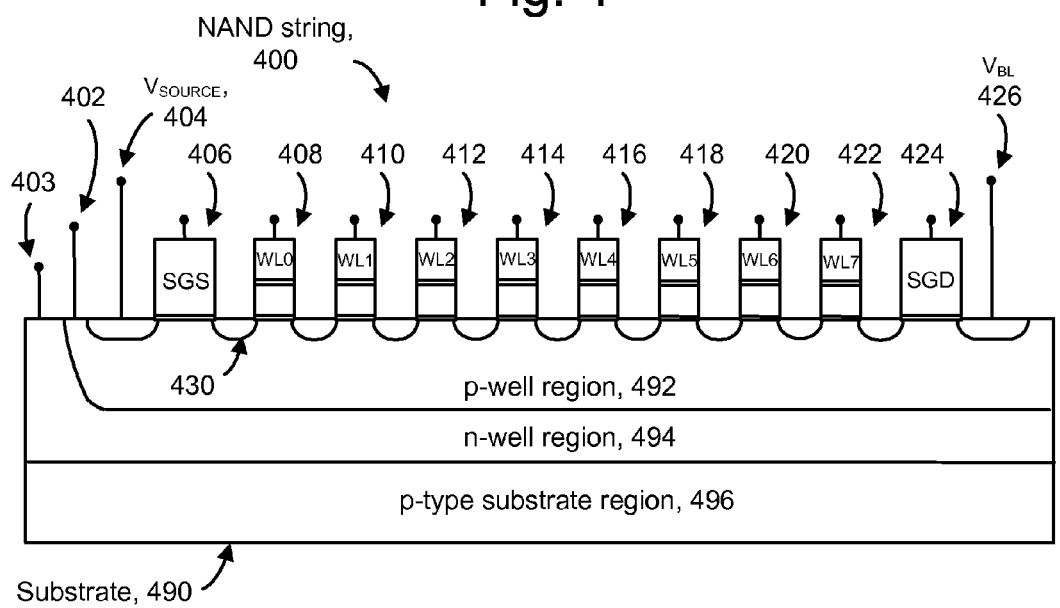
FIG. 4 depicts a cross-sectional view of a NAND string formed on a substrate.

FIG. 4 depicts a cross-sectional view of a NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one approach, the substrate 490 employs a triple-well technology which includes a p-well region 492 within an n-well region 494, which in turn is within a p-type substrate region 496. The NAND string and its non-volatile storage elements can be formed, at least in part, on the p-well region. A source supply line 404 with a potential of $V_{SOURCE}$ is provided in addition to a bit line 426 with a potential of $V_{BL}$. In one possible approach, a voltage can be applied to the p-well region 492 via a terminal 402. A voltage can also be applied to the n-well region 494 via a terminal 403.

During a read or verify operation, including an erase-verify operation, in which the condition of a storage element, such as its threshold voltage, is ascertained, $V_{CGR}$ is provided on a selected word line which is associated with a selected storage element. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A read pass voltage, $V_{READ}$, can be applied to unselected word lines associated with NAND string 400, in one possible boosting scheme. Other boosting schemes apply $V_{READ}$ to some word lines and lower voltages to other word lines. $V_{SGS}$ and $V_{SGD}$ are applied to the select gates 406 and 424, respectively.

Figure 5:
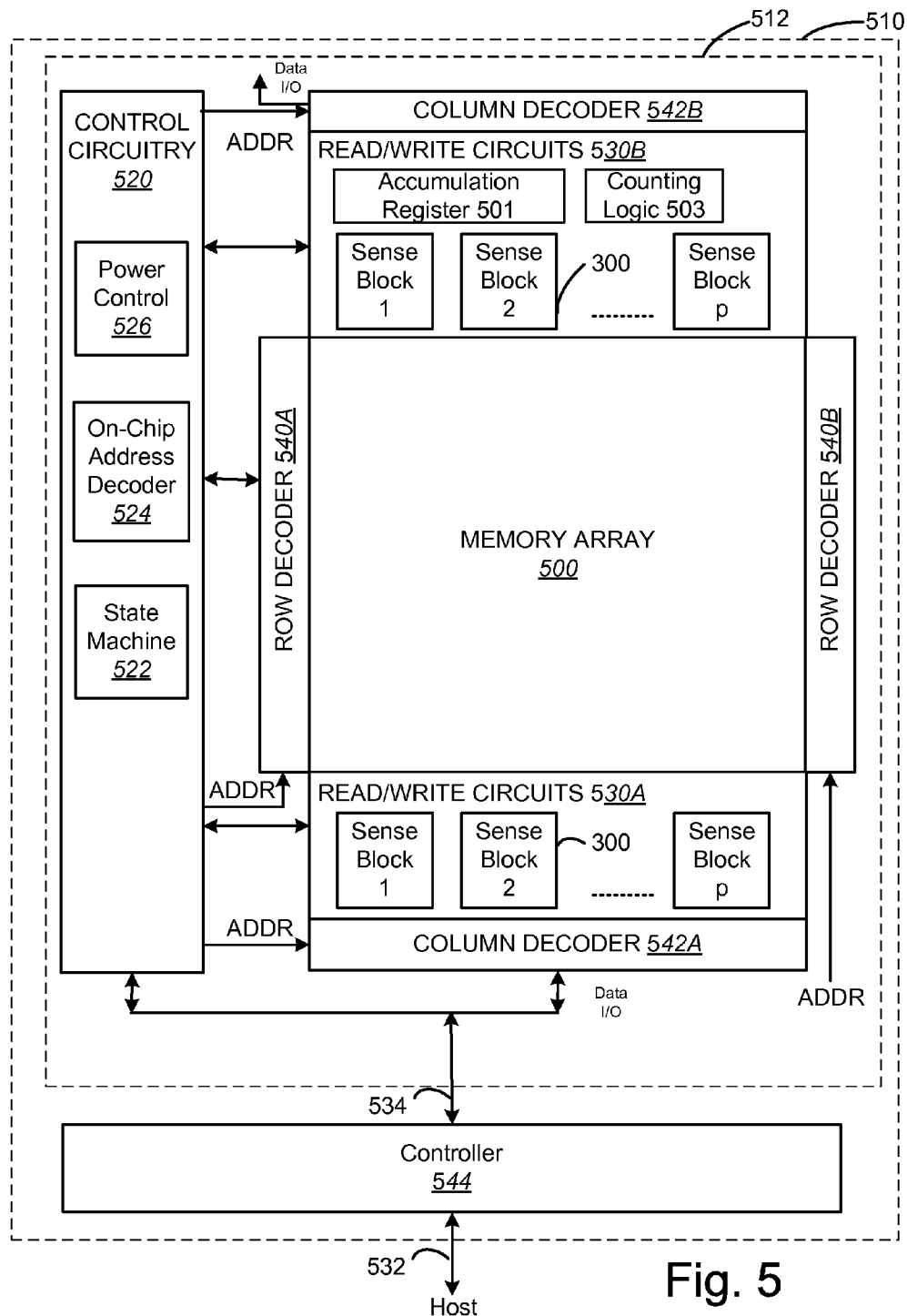
FIG. 5 illustrates a non-volatile storage device that may include one or more memory die or chips.

FIG. 5 illustrates a non-volatile storage device 510 that may include one or more memory die or chips 512. Memory die 512 includes an array (two-dimensional or three dimensional) of memory cells 500, control circuitry 520, and read/write circuits 530A and 530B. In one embodiment, access to the memory array 500 by the various peripheral circuits is implemented in a symmetric fashion, on opposite sides of the array, so that the densities of access lines and circuitry on each side are reduced by half. The read/write circuits 530A and 530B include multiple sense blocks 300 which allow a page of memory cells to be read or programmed in parallel. The memory array 500 is addressable by word lines via row decoders 540A and 540B and by bit lines via column decoders 542A and 542B. In a typical embodiment, a controller 544 is included in the same memory device 510 (e.g., a removable storage card or package) as the one or more memory die 512. Commands and data are transferred between the host and controller 544 via lines 532 and between the controller and the one or more memory die 512 via lines 534. One implementation can include multiple chips 512.

Control circuitry 520 cooperates with the read/write circuits 530A and 530B to perform memory operations on the memory array 500. The control circuitry 520 includes a state machine 522, an on-chip address decoder 524 and a power control module 526. The state machine 522 provides chip-level control of memory operations. The on-chip address decoder 524 provides an address interface to convert between the address that is used by the host or a memory controller to the hardware address used by the decoders 540A, 540B, 542A, and 542B. The power control module 526 controls the power and voltages supplied to the word lines and bit lines during memory operations. In one embodiment, power control module 526 includes one or more charge pumps that can create voltages larger than the supply voltage.

In one embodiment, one or any combination of control circuitry 520, power control circuit 526, decoder circuit 524, state machine circuit 522, decoder circuit 542A, decoder circuit 542B, decoder circuit 540A, decoder circuit 540B, read/write circuits 530A, read/write circuits 530B, and/or controller 544 can be referred to as one or more managing circuits.

The memory die 512 has counting logic 503 and an accumulation register 501, in one embodiment. Accumulation register 501 may be a signed register. The counting logic 503 is used when determining whether there is a defect in programming, in one embodiment. The counting logic 503 accumulates a count in the accumulation register 501 and determines that there is a defect of the count exceeds a criterion (e.g., threshold), in one embodiment. Further details are discussed below.

FIG. 6A depicts an exemplary structure of memory cell array 500. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller (described below) calculates the ECC parity when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 6A also shows more details of block i of memory array 500. Block i includes X+1 bit lines and X+1 NAND strings. Block i also includes 64 data word lines (WL0-WL63), two dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 6B:
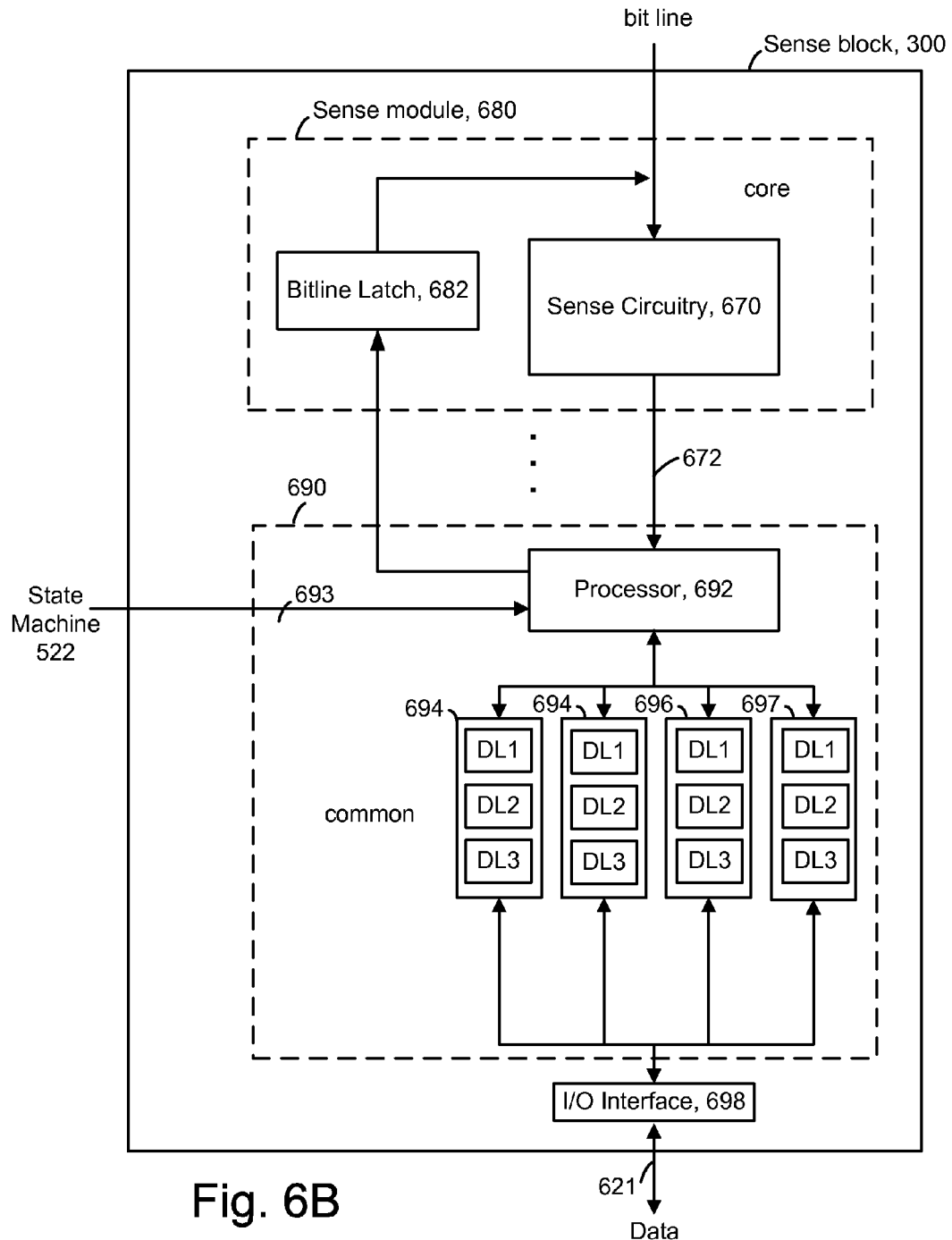
FIG. 6B is a block diagram depicting one embodiment of a sense block.

FIG. 6B is a block diagram depicting one embodiment of a sense block 300. An individual sense block 300 is partitioned into a core portion, referred to as a sense module 680, and a common portion 690. In one embodiment, there is a separate sense module 680 for each bit line and one common portion 690 for a set of multiple sense modules 680. In one example, a sense block 300 will include one common portion 690 and eight sense modules 680. Each of the sense modules in a group will communicate with the associated common portion via a data bus 672.

Sense module 680 comprises sense circuitry 670 that determines whether a conduction current in a connected bit line is above or below a predetermined threshold level. Sense module 680 also includes a bit line latch 682 that is used to set a voltage condition on the connected bit line. For example, a predetermined state latched in bit line latch 682 will result in the connected bit line being pulled to a state designating program inhibit (e.g., 1.5-3 V). As an example, a flag=0 can inhibit programming, while flag=1 does not inhibit programming.

Common portion 690 comprises a processor 692, three example sets of data latches 694 and an I/O Interface 698 coupled between the sets of data latches 694 and data bus 621. One set of data latches can be provided for each sense module, and three data latches identified by DL1, DL2, and DL3 may be provided for each set. The use of the data latches is further discussed below.

Processor 692 performs computations. For example, one of its functions is to determine the data stored in the sensed storage element and store the determined data in the set of data latches. At least some of the data latches in a set of data latches (e.g., 694) are used to store data bits determined by processor 692 during a read operation. At least some of the data latches in a set of data latches are also used to store data bits imported from the data bus 621 during a program operation. The imported data bits represent write data meant to be programmed into the memory. I/O interface 698 provides an interface between data latches 694-697 and the data bus 621.

The processor 692 may perform some of the logic for detecting defects during programming. For example, the processor 692 could combine results of sensing operations to form sub-groups, as discussed below. The data latches DL1-DL3 could be used to store intermediate results when detecting such defects.

In one embodiment, data is stored in the DL1 and DL2 latches at the beginning of the program operation. For example, lower page data may be stored in DL1 and upper page data may be stored in DL2. In one embodiment, lower page data that is read from memory cells during an IDL is stored in the DL1 latches. DL3 may be used to store verify status, such as lockout status during programming. For example, when a memory cell's Vt has been verified a reaching its target level, the DL3 latch can be set to indicate this such that further programming of the memory cell may be inhibited. Note this describes programming two bits per memory cell. In one embodiment, during a read operation, the DL1 and DL2 latches are used to store the two bits that are read from the memory cell. Note that there may be more than two bits per memory cell. There can be one additional latch for each additional bit to be stored per memory cell.

During reading or other sensing, the state machine 622 controls the supply of different control gate voltages to the addressed storage element. As it steps through the various control gate voltages corresponding to the various memory states supported by the memory, the sense module 680 may trip at one of these voltages and an output will be provided from sense module 680 to processor 692 via bus 672. At that point, processor 692 determines the resultant memory state by consideration of the tripping event(s) of the sense module and the information about the applied control gate voltage from the state machine via input lines 693. It then computes a binary encoding for the memory state and stores the resultant data bits into data latches (e.g., 694). In another embodiment of the core portion, bit line latch 682 serves both as a latch for latching the output of the sense module 680 and as a bit line latch as described above.

Some implementations can include multiple processors 692. In one embodiment, each processor 692 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 692 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 694-697 from the data bus 621.

The program operation, under the control of the state machine, comprises a series of programming voltage pulses applied to the control gates of the addressed storage elements. Each program pulse is followed by a read back (verify) to determine if the storage element has been programmed to the desired memory state. Processor 692 monitors the read back memory state relative to the desired memory state. When the two are in agreement, the processor 692 sets the bit line latch 682 so as to cause the bit line to be pulled to a state designating program inhibit. This inhibits the storage element coupled to the bit line from further programming even if program pulses appear on its control gate. In other embodiments, the processor initially loads the bit line latch 682 and the sense circuitry sets it to an inhibit value during the verify process.

Each set of data latch stacks 694-697 contains a stack of data latches corresponding to the sense module 680, in one embodiment. In one embodiment, there are three data latches per sense module 680. All the DL1 and DL2 data latches corresponding to the read/write block of m storage elements can be linked together to form a block shift register so that a block of data can be input or output by serial transfer.

In one embodiment, one purpose of the DL1 and DL2 latches is to store data that is to be programmed into a storage element. For example, the storage elements may store two bits per storage element. In one embodiment, lower page data is initially stored into the DL1 latches and upper page data is initially stored into the DL2 latches.

In one embodiment, the storage elements store three bits per storage element. In this case, there may be an additional data latch (not depicted in FIG. 6B) for initially storing the third bit of data that is to be programmed into a storage element. In one embodiment, the storage elements store four bits per storage element, in which case there may be two additional data latches (not depicted in FIG. 6B) for initially storing the third and fourth bits of data that is to be programmed into a storage element. The storage elements could store more than four bits per storage element, in which case there may be one data latch for each bit.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Figure 7A:
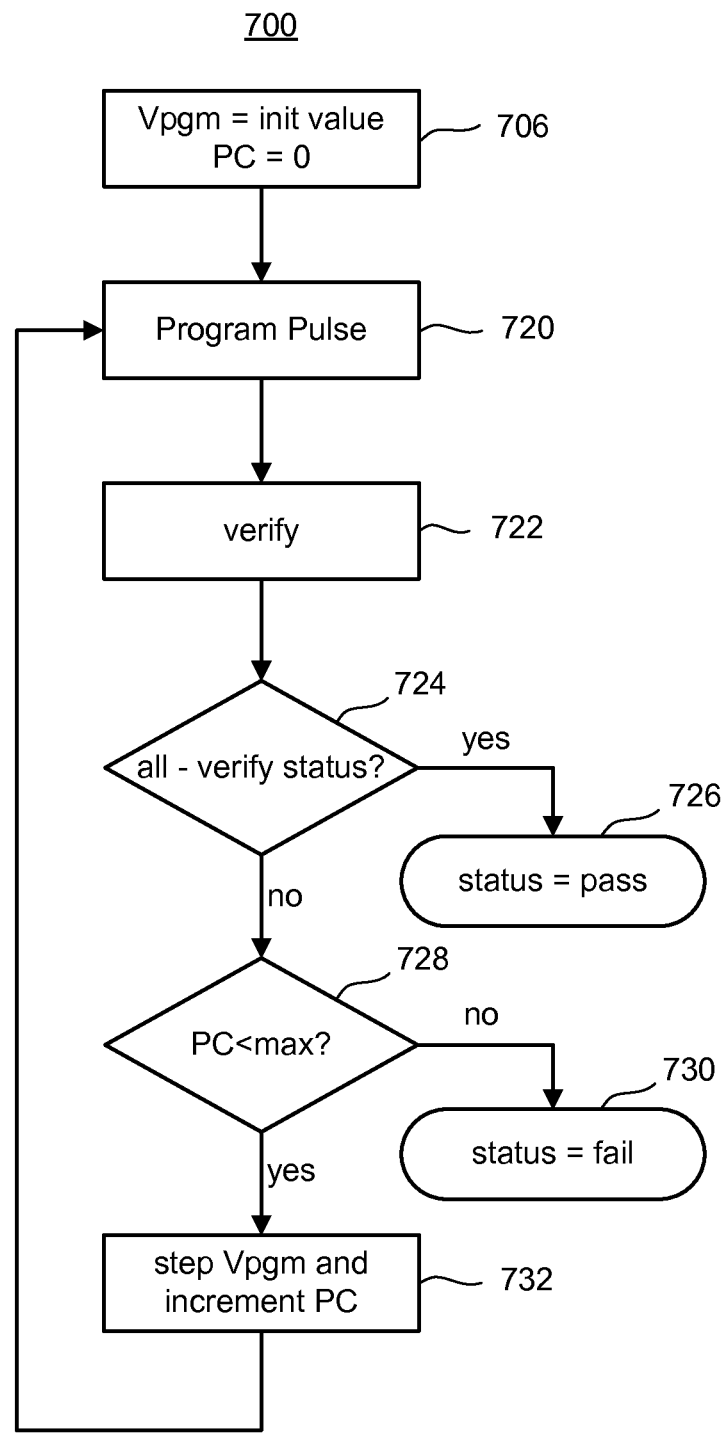
FIG. 7A is a flowchart describing one embodiment of a programming process, which includes one or more verification steps.

FIG. 7A is a flowchart describing one embodiment of a programming process 700, which includes one or more verification steps. Any of the programming sequences described herein may be used, as well as other programming sequences.

In step 706, the program voltage (Vpgm) is set to an initial value. Also, in step 706, a program counter (PC) is initialized to zero. In step 720, a program pulse is applied.

In step 722, a verification process is performed. In step 724, it is determined whether memory cells have verified that their threshold voltages are at the final target voltage for that memory cell. Note that it is not required that every memory cell for a given state is verified to be at the appropriate threshold voltage. Error correction is able to correct for some memory cells being below their target threshold voltage. Error correction is able to correct for some memory cells being over-programmed. Step 724 is referring to all states having completed programming.

If verification passes, the programming process is completed successfully (status=pass) in step 726. If all of the memory cells are not all verified, then it is determined whether the program counter (PC) is less than a maximum value such as 20. If the program counter (PC) is not less than max (step 728), then the program process has failed (step 730). If the program counter (PC) is less than a maximum value (e.g., 20), then the program counter (PC) is incremented by 1 and the program voltage is stepped up to the next pulse in step 732. Subsequent to step 732, the process loops back to step 720 and the next program pulse is applied to the memory cells.

Figure 7B:
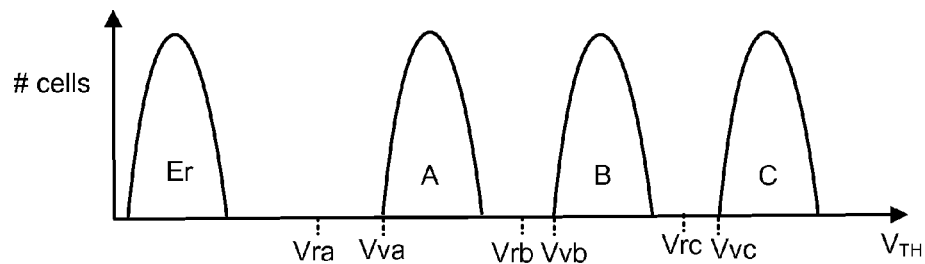
FIG. 7B illustrates example Vt distributions corresponding to data states for the memory cell array when each memory cell stores two bits of data.

At the end of a successful programming process (with verification), the threshold voltages of the memory cells should be within one or more distributions of threshold voltages for programmed memory cells or within a distribution of threshold voltages for erased memory cells, as appropriate. FIG. 7B illustrates example Vt distributions corresponding to data states for the memory cell array when each memory cell stores two bits of data. Other embodiment, however, may use more or fewer than three bits of data per memory cell. FIG. 7B shows four Vt distributions corresponding to an Erase state and programmed states A-C. In one embodiment, the threshold voltages in the Erase state are negative and the threshold voltages in the programmed states A-C are positive. However, the threshold voltages in one or more of programmed states A-C may be negative. Some or all of the threshold voltages in the Erase state could be positive.

Between each of the data states Erase-C are read reference voltage levels used for reading data from memory cells. For example, FIG. 7B shows read reference voltage VrA between the erase state and the A-state, VrB between the A-state and B-state, and VrC between the B-state and C-state. By testing whether the threshold voltage of a given memory cell is above or below the respective read reference voltages, the system can determine what state the memory cell is in.

At or near the lower edge of each programmed state are verify reference voltages. For example, FIG. 7B shows VvA for the A-state, VvB for the B-state, and Vvc for the C-state. When programming memory cells to a given state, the system will test whether those memory cells have a threshold voltage greater than or equal to the verify reference voltage.

Figure 7C:
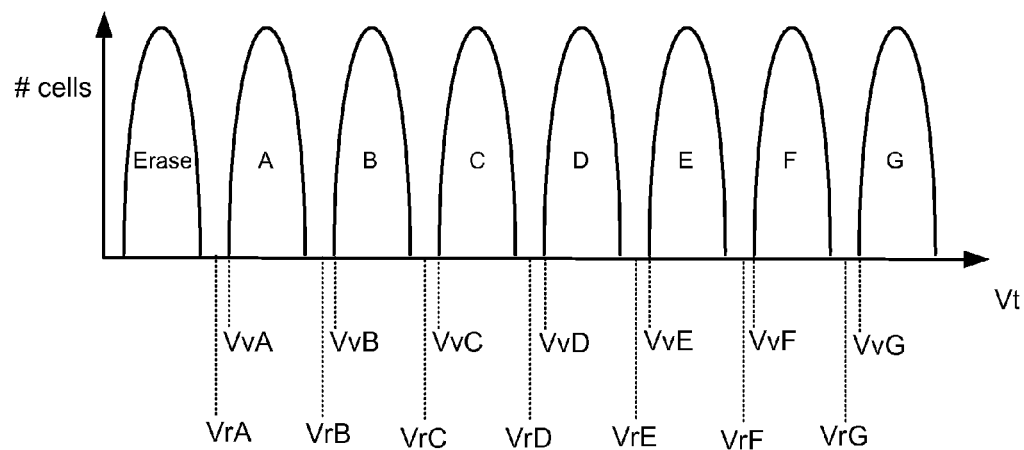
FIG. 7C shows an example of threshold voltage distributions for storage elements that stores three bits per storage element.

FIG. 7C shows an example of threshold voltage distributions for storage elements that stores three bits per storage element. In this case, there are eight states, Erase and A-G. Verify levels VvA-VvG are depicted for verifying the A-state through G-state. Read reference voltages VrA-VrG are depicted between the various states.

Note that the Vt distributions can partially overlap since the error correction algorithm can handle a certain percentage of cells that are in error. Also note that contrary to the equal spacing/width of the depicted threshold voltage distributions, various distributions may have different widths/spacings in order to accommodate varying amounts of susceptibility to data retention loss.

In some embodiments, the number of memory cells in each of the states is about the same, assuming that there is not a defect with programming. For example, for the example of FIG. 7B, each state has about 25% of the memory cells. For the example of FIG. 7C, each state has about 12.5% of the memory cells.

Figure 7D:
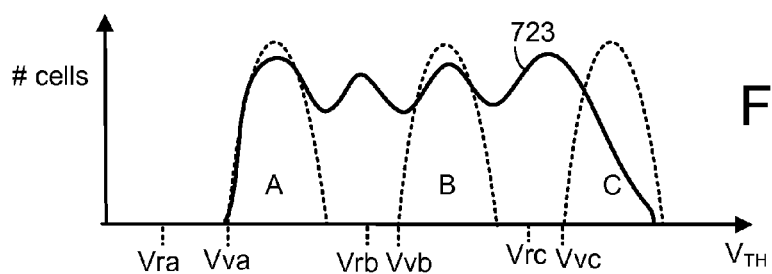
FIG. 7D is a diagram showing threshold voltage distributions for a device having a program defect.

However, note that if there is a defect with programming, then the distribution might not be even across the states. FIG. 7D depicts an example of one possible threshold distributions for memory cells for which there was a program defect. Note that only the portion corresponding to states A-C is depicted. This could be for a defect such as a broken word line, or some other program defect. The dashed lines represent $V_{TH}$ distributions if there is not a defect and programming is successful at creating an even distribution. Line 723 represents an example in which the $V_{TH}$ distribution might not be even across states due to a program defect.

One technique for achieving an equal distribution is to randomize the data prior to programming it in the storage elements. Data scrambling is one technique for randomizing the data. Thus, data scrambling is one technique for achieving the substantially even distribution of the non-volatile storage elements in the data states. However, techniques other than data scrambling can be used. The following are some examples of data scrambling that may be performed to randomize the data, although other data scrambling techniques could be used.

Data Scrambling

Data scrambling for non-volatile memory such as NAND memories has become increasingly important in addressing system reliability issues that are inherently susceptible by design to worst-case data patterns which trigger memory program failures. The data patterns which induce memory failures are referred to as worst-case patterns. Such failures are catastrophic due to uncorrectable error correction code (ECC) decoding as a result of program disturb. Moreover, program disturb issues depend on memory bit-line cell states in adjacent word lines and in series of word lines. Worst-case patterns include fixed repetitive data such as may be found in control data and file access table (FAT) areas. FAT data relates to file system data, and how file names, folders and the like are organized. Worst-case patterns may be caused by other factors as well. For example, a word line with more low state storage elements may be disturbed by a word line with more high state cells. Data scrambling randomizes the distribution of data states in the storage elements so that worst-case data patterns are avoided. Data scrambling and descrambling should be transparent to the user.

Data scrambling results in a substantially uniform (or even) population of storage elements in different data states, in some embodiments. Data scrambling can be performed on or off of the memory die.

Figure 8A:
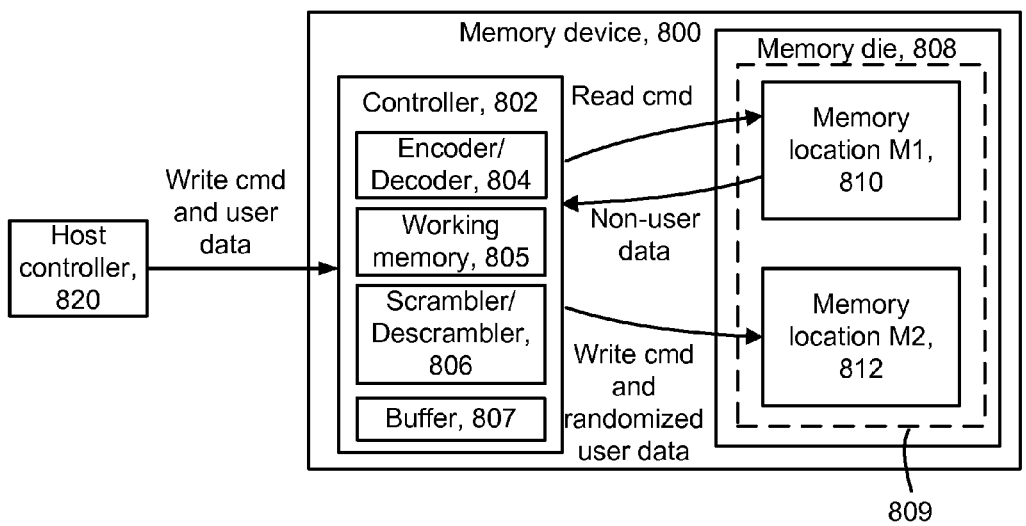
FIG. 8A depicts scrambling performed by a controller in a storage system in which non-user data and user data are stored in corresponding portions of different memory locations.

FIG. 8A depicts scrambling performed by a controller in a storage system in which non-user data and user data are stored in corresponding portions of different memory locations. One approach involves performing scrambling and descrambling of data at an off-chip controller circuit, where non-user data is stored on-chip, and user data which is encoded using the non-user data is also stored on-chip. A chip refers to a memory die on which a memory array is formed. The non-user data can be a predetermined random or pseudo random pattern of data which is used for scrambling the user data, or can be any pattern such as a test pattern. For example, a pure pattern of all zeroes or all ones could be used. The pattern need not be random or pseudo random.

Storing non-user data in the memory array is advantageous because it allows a large amount of data to be stored, e.g., a few megabytes. Such a large amount of data can be more random compared to a fixed length key of several bits in length. Further, the non-user data can be more random because it does not have to be generated a certain way such as by key shifting. The non-user data can be generated at the time of manufacture, for instance, using any technique. The non-user data can be stored in one portion of the memory array such as a block and used by a number of other portions of the memory array, such as other blocks, to encode or scramble user data which is to be stored in the other blocks. Similarly, during a reverse decoding process, scrambled or otherwise encoded user data is descrambled or otherwise decoded using the same non-user data.

Note that scrambling is considered to be a form of encoding and descrambling is considered to be a form of decoding. The terms scrambling and descrambling and the like will be used in specific examples herein in which random or pseudorandom data is used to encode or decode user data. However, a general process of coding or decoding may be substituted in place of scrambling and descrambling, respectively.

The memory device 800 includes a memory die 808 on which a number of memory locations are formed. The memory device 800 may be formed on a removable memory card or USB flash drive, for instance, which is inserted into a host device such as a laptop computer, digital camera, personal digital assistant (PDA), digital audio player or mobile (cell) phone. Such a card may include the entire memory device. Or, the controller and memory array, with associated peripheral circuits, may be provided in separate cards. Or, the memory device 800 may be embedded as part of the host system. The host device may have its own controller 820 for interacting with the memory device 800, such as to read or write user data. For example, the host controller 820 can send commands to the memory device to write or read data. The memory device controller 802 converts such commands into command signals that can be interpreted and executed by control circuitry in the memory device. The controller 802 may also contain buffer memory 807 for temporarily storing the user data being written to or read from the memory array.

A memory array 809 having a number of blocks of storage elements may be formed on the memory die 808. Example memory locations M1 810 and M2 812 of the memory array, which may be respective blocks, are depicted. The off-chip controller 802 is part of the memory device 800, and includes an encoder/decoder 804 and a scrambler/descrambler 806. In a write process, the controller 802 receives a write command and user data from the host controller 820. The write command may specify addresses in the memory array to store the user data. When the controller 802 receives the write command (cmd) and user data, it provides a read command to the first memory location M1 810 to read non-user data. The scrambler/descrambler 806 uses the non-user data to scramble the user data, thereby providing modified user data, which is written to the second memory location M2 812. Before scrambling, the encoder/decoder 804 may encode the user data such as by performing ECC coding and adding overhead data such as ECC parity bits.

The memory location in which the non-user data is stored may be of the same type as which the user data is stored, or of a different type. For example, the non-user data can be stored, e.g., in anti-fuses, which store data permanently once written, or in erasable non-volatile storage elements.

Different portions of the user data may be scrambled or otherwise encoded by a corresponding portion of the non-user data. For example, a portion of the user data which is stored on an nth word line in memory location M2 may be scrambled or otherwise encoded by non-user data which is stored on an nth world line in memory location M1. A portion of the user data on an ith page in M2 may be scrambled or otherwise encoded by non-user data on an ith page in M1. Each word line may have one or more pages. Further, a page may be made up of sub-pages, such that a portion of the user data on a jth sub-page in M2 may be scrambled or otherwise encoded by non-user data on a jth sub-page in M1. There may be multiple sub-pages per word line, for instance. Generally, any unit of the user data may be scrambled or otherwise encoded by a corresponding unit of non-user data, where the scrambled user data and non-user data are stored in corresponding locations in their respective blocks. The scrambled user data may be stored in the same location in M2 as the corresponding non-user data is stored in M1, or the scrambled user data may be stored in a location in M2 which is based on, but not the same as, the location of the corresponding non-user data in M1, such as by using an offset, e.g., non-user data is stored on WL1 in M1, user data is stored on WL2 in M2, or non-user data is stored on page-n in M1, and user data is stored on page n+1 in M2. Various other approaches are possible.

Moreover, the same block of non-user data may be used to scramble multiple blocks of user data. This reduces the relative overhead cost of storing the non-user data. For example, assume the user data which the host requests to write to the memory array is large enough that it is stored in multiple blocks. In this case, each portion of the user data in a respective portion of each block may be scrambled using the same portion of the non-user data. For example, non-user data of WL1 of block M1 is used to scramble user data of WL1 of block M2 and user data of WL1 of additional block M3. Another option is to change the non-user data which is used to encode each block such as by shifting the non-user data, e.g., scramble user data of WL1 in memory location M2 using non-user data of WL1 in memory location M1, scramble user data of WL2 in memory location M3 using non-user data of WL1 in memory location M1, etc. Or, scramble user data of WL1 in memory location M2 using non-user data of WL1 in memory location M1, scramble user data of WL21 in memory location M3 using non-user data of WL2 in memory location M1, etc. Generally, it is sufficient to provide random or pseudo random scrambling within a block, as data pattern failures as most affected by intra-block data patterns. However, providing randomization across blocks can also be desirable.

During a write process, the controller 802 responds to a write command from the host controller 820 by encoding, scrambling and writing user data to the memory array. In one possible approach, the controller 800 stores the user data in the buffer 807, processes and writes the user data to the memory array 809, and informs the host controller 820 that additional data can be received, at which time the controller stores the additional user data in the buffer 807, processes and writes the additional user data to the memory array 809, and so forth. The controller 802 may write portions of the user data which are smaller than what is requested to be written in the write command from the host controller 820, or the controller 802 may write portions of the non-user data which are same as what is requested to be written by the host controller 820. For example, the controller 802 may receive one page of data to be written. In response, the controller 802 reads one page of non-user data from the memory location M1, stores it in its working memory 805 with the user data, scrambles the user data to provide modified user data which is also stored in its working memory 805, and writes the page of modified user data to the memory location M2. In another approach, the controller 802 processes the user data in smaller units than one page so that multiple iterations of reading non-user data, scrambling the user data and writing the scrambled user data are performed. In another approach, the controller 802 reads one page of non-user data, but performs multiple iterations of scrambling the user data and writing the scrambled user data.

Typically, the controller 802 informs the host controller 820 when it can receive additional user data to be written. The host controller 820 can respond by sending another write command with associated user data to the memory device. For example the data may be written page by page.

The scrambling process of the scrambler/descrambler 806 may involve performing one or more logical operations, e.g., AND, XOR and/or NOR operations which involve the user data and the non-user data. The controller 802 may read successive portions of the non-user data to scramble corresponding successive portions of the user data, one portion at a time, in one approach. The controller may have a processor, working memory 805 and other components as needed to carry out the desired functions. In one approach, the controller 802 loads user data and non-user data to respective latches, performs a logical operation involving the user data and non-user data, and stores a result of the operation in another latch as the scrambled user data which is written to the memory array 809.

Figure 8B:
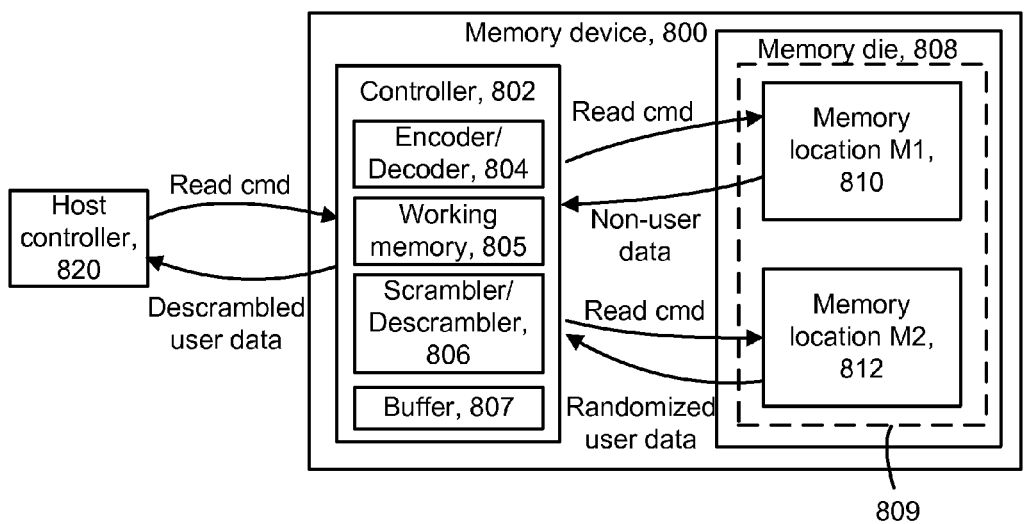
FIG. 8B depicts descrambling performed by a controller in a storage system in which non-user data and user data are stored in corresponding portions of different memory locations.

FIG. 8B depicts descrambling performed by a controller in a storage system in which non-user data and user data are stored in corresponding portions of different memory locations. In a reverse process to that of FIG. 8A, scrambled data is read from the memory array 809. For example, the host controller 820 may provide a read command to the controller 802 which specifies an address of user data to be read. In response to the read command, the controller 802 reads the corresponding user data, from memory location M2 in a scrambled form, for instance. The controller 802 also reads non-user data which corresponds to the user data, from memory location M1, and descrambles the user data. Decoding may also be performed, such as ECC decoding, to obtain the user data in a form which is made accessible to the host controller 820. Specifically, the controller 802 may store the decoded user data in the buffer 807 and inform the host controller 820 that the data is available to be read in a format which is acceptable to the host controller. After reading the data, the host controller 820 may issue a further read command to the controller 802.

By analogy to the write process discussed previously, portions of the scrambled or otherwise modified user data are read from respective locations in the memory array and descrambled using non-user data which is read from corresponding respective locations in the memory array. For example, a portion of the user data on an ith page in M2 may be descrambled or otherwise decoded by non-user data on an ith page in M1. Each word line may have one or more pages. Further, a page may be made up of sub-pages, such that a portion of the user data on a jth sub-page in M2 may be descrambled or otherwise decoded by non-user data on a jth sub-page in M1.

Moreover, the controller 802 may read portions of the user data which are smaller than what is requested to be read in the read command from the host controller 820, or the controller 802 may read portions of the non-user data which are same as what is requested to be read by the host controller 820.

The descrambling process may involve performing one or more logical operations, e.g., AND, XOR and/or NOR, involving the scrambled or other wise modified user data and the non-user data. The controller may read successive portions of the non-user data to descramble corresponding successive portions of the user data, one portion at a time, in one approach. The controller may have a processor, working memory 805 and other components as needed to carry out the desired functions. In one approach, the controller 802 loads user data and non-user data to respective latches, performs a logical operation involving the user data and non-user data, and stores a result of the operation in another latch as the descrambled user data which is made available in the buffer 807 for the host controller 820. The descrambled user data may be subject to additional decoding such as ECC decoding, as mentioned.

An alternative to the storage systems of FIGS. 8A and 8B is to provide the non-user data of memory location M1 in the controller 802 rather than in the memory array. In this case, the controller 802 can quickly combine the user data and the non-user data to provide the scrambled data without the need to transfer a relatively large amount of data from the memory die. This reduces overhead costs incurred by such a data transfer. However, additional memory is needed at the controller to store the non-user data. The controller 802 can use non-volatile memory such as anti-fuses in this approach.

Figure 9A:
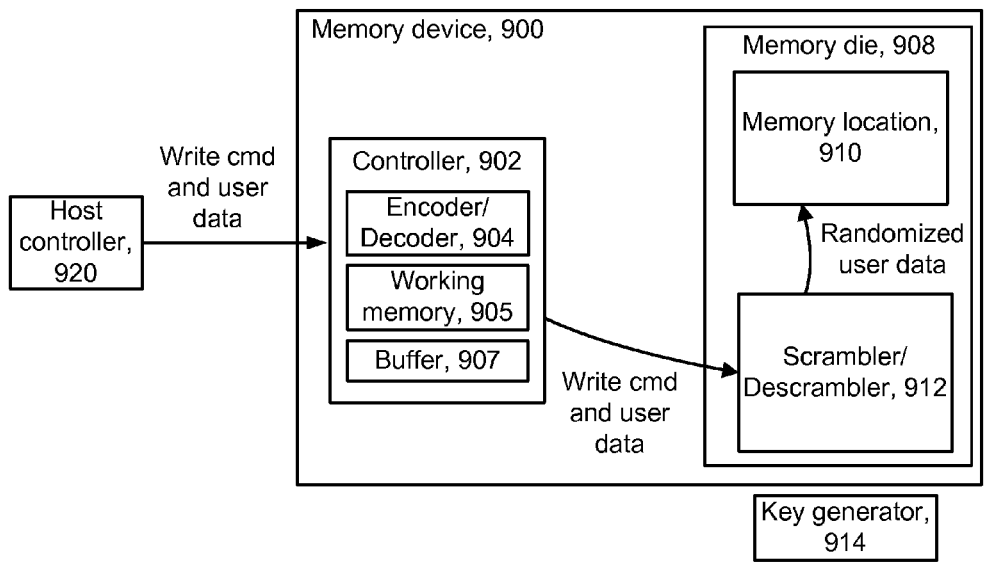
FIG. 9A depicts scrambling performed by on-chip circuitry using a key generator in a storage system.

FIG. 9A depicts scrambling performed by on-chip circuitry using a key generator in a storage system. In this approach, a scrambler/descrambler 912 is on the memory die 908 rather than in a controller 902 of the memory device 900. This approach provides portability of the memory die so that it can be used with different controllers, for instance, which are made by different manufacturers. The scrambler/descrambler 912 may be a state machine, for instance. In one possible approach, the host controller 920 provides a write command and associated user to the controller 902, which in turn communicates one or more corresponding write commands and the user data to the scrambler/descrambler 912 on the memory die 908. The controller 902 may process the user data such as by performing ECC coding and adding overhead data at an encoder/decoder 904. With this approach, the overhead data is also scrambled with the user data. This helps avoid header and ECC type data pattern failures. The scrambler/descrambler 912 may use a key generator 914 to generate different random or pseudo random keys, where each key is used to scramble a different portion of the user data. The scrambled user data is then written to a memory location 910. The controller 902 may have a working memory 905 and buffer 907. As with the approach of FIG. 8A, the user data may be scrambled and written in successive portions which are smaller than the amount of data provided by the host, or in a single unit which is the same as provided by the host.

Figure 9B:
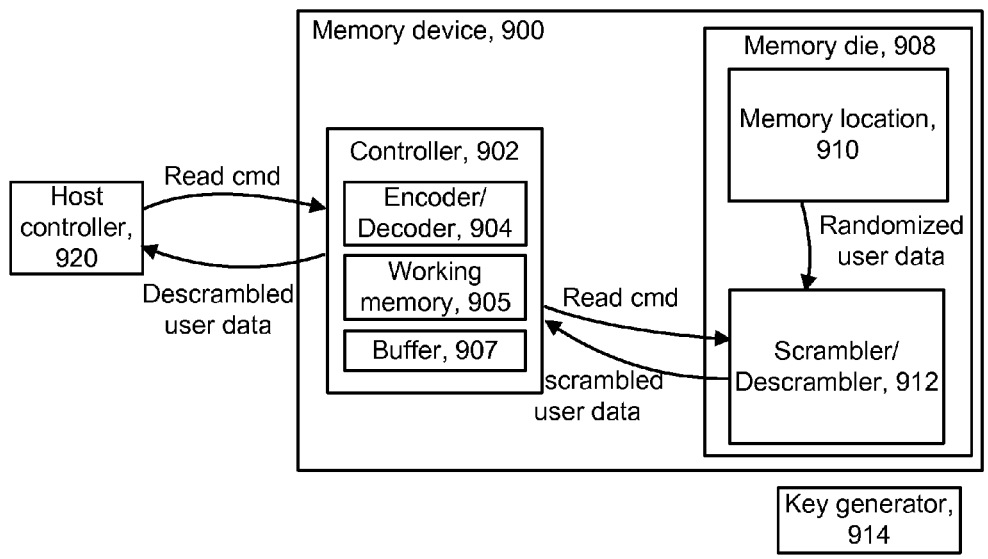
FIG. 9B depicts descrambling performed by on-chip circuitry using a key generator in a storage system.

FIG. 9B depicts descrambling performed by on-chip circuitry using a key generator in a storage system. In a process which is the reverse of that depicted in FIG. 9A, the controller receives a read command from the host controller 920. The read command may specify an address in which the requested user data was stored. The controller 902 provides one or more corresponding read commands to the scrambler/descrambler 912. The scrambler/descrambler 912 may use the key generator 914 to generate the different random or pseudo random keys which were used for scrambling, where each key is used to descramble a different portion of the user data. The descrambled user data is then provided to the controller 902 and stored in the buffer 907 for read out by the host controller 920. As with the approach of FIG. 8B, the user data may be read and descrambled in successive portions which are smaller than the amount of data request by the host, or in a single unit which is the same as requested by the host.

Generally, it is desirable for each word line to be randomized as well as each set of word lines. After the scrambling operation is performed, the scrambled user data may be stored in a latch of size, e.g., 4,096 bytes, and written to the designated memory location.

Figure 10:
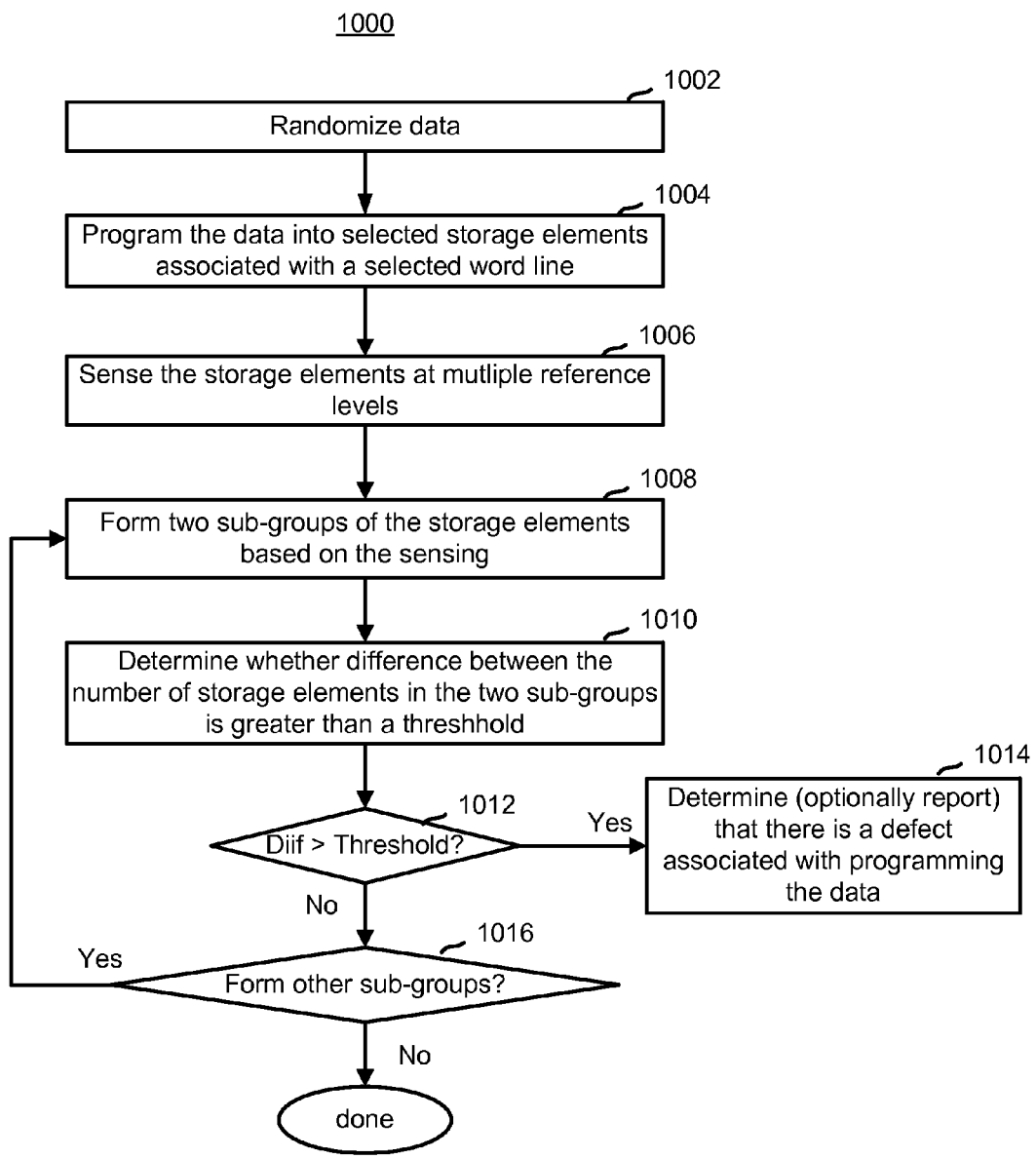
FIG. 10 depicts a flowchart of one embodiment of a process of determining whether there is a defect associated with programming of data into selected non-volatile storage elements.

FIG. 10 depicts a flowchart of one embodiment of a process 1000 of determining whether there is a defect associated with programming of data into selected non-volatile storage elements. In step 1002, data that is to be programmed into the storage elements is randomized. Scrambling the data is one technique for randomizing it. The scrambling techniques described herein could be used, but process 1000 is not limited to these scrambling techniques. The randomizing could be performed on chip or off chip. The steps could be performed in a different order than depicted in FIG. 10.

In step 1004, the data is programmed into selected non-volatile storage element. As one example, storage elements associated with a selected word line are programmed. This might be all of the storage elements associated with the word line, or some subset of the storage elements associated with the word line. The process of FIG. 7A may be used to program the data. The storage elements could be programmed to any number of data states including, but not limited to, two data states, four data states, eight data states, and sixteen data states. Note that after process 700, the status could be pass or fail. Either result is a valid ending for step 1004. The following steps will look for a defect that occurred during the programming. A defect can be detected whether the programming process ended with a status of pass or fail.

In one embodiment, step 1004 results in programming data into a group of non-volatile storage elements that, if successful, results in a substantially even distribution of the non-volatile storage elements in the different data states. Note that it is not a requirement that the data be randomized to meet the foregoing. That is, so long as the distribution is substantially even across the states, the data is not required to be randomized.

In step 1006, the storage elements are sensed. In one embodiment, they are sensed at multiple reference levels. In one embodiment, they are sensed at a single reference level. Sensing at a given reference level includes applying a given reference voltage level to the selected word line and then determining whether each respective storage element conducts a current in response, in one embodiment.

As one example, the storage elements are sensed at three reference levels. For the case in which storage elements each store two bits, these can be read reference levels VrA, VrB, and VrC. In this example, there is a read reference level for each "gap" between two of the states. The reference level is not required to be the exact same reference level that is used when sensing the storage elements for a read operation.

Note that step 1006 can also apply to the case in which three bits are stored per memory cell. In this case, the cells could be sensed at three references levels such as, VrB, VrD, and VrF. However, different reference levels could be used. Also, step 1006 can include sensing at more than three reference levels. For example, sensing could take place at read reference levels VrA-VrG. Again, the reference levels used in step 1006 are not required to be the exact same reference levels used during a read operation.

In step 1008, two sub-groups of memory cells are formed based on results of the sensing of step 1006. For the sake of discussion, these will be referred to as a first and second sub-group. There should be the same number of states in each sub-group. Each sub-group includes at least two of the data states, in one embodiment. In one embodiment, each sub-group contains a single data state. First an example will be described in which the memory cells store two bits per cell. In this example, the first sub-group may be states (Er, B) and the second sub-group may be (A, C). For example, memory cells are placed into the first sub-group if the results of the sensing make it appear that their threshold voltage is in either the erase- or B-state. Note that a defect in the word line might make it appear that the memory cells' $V_{TH}$ is other than it really is. For example, a word line defect might result in the read reference voltage not actually being applied to a certain memory cell. Note that as described herein a phrase such as, "a sub-group includes a data state" or the like means that the sub-group includes memory cells that appear to have a threshold voltage that corresponds to that data state, based on the sensing results.

Note that in this example, each of the sub-groups includes two data states that are separated by a data state in the other sub-group. Referring to FIG. 7B, Er and B are separated by A. Likewise, A and C are separated by B. Also in this case, there are no adjacent data states in either the first sub-group or in the second sub-group. For example, Er is not adjacent to B. Likewise, A is not adjacent to C. Forming groups such that there is separation of data states helps to better detect defects. It is possible that some defects could be masked otherwise. Also, all of the data states are in either the first sub-group or in the second sub-group. This means that all data states can be tested in a simple comparison operation.

In general, the separation of data states does not need to hold for both of the sub-groups. An example of this is for the first sub-group to be (Er, C) and the second sub-group to be (A, B). In this example, the first sub-group includes two data states that are separated by a data state of the other group (either the A or B state). However, the separation of data states does not hold for the second sub-group (A, B).

Next, an example will be discussed in which the memory cells store three bits per memory cell. The first sub-group could be (Er, A, F, G) and the second sub-group could be (B, C, D, E). In this example, the first group includes two data states that are separated by a data state in the other group. As one example, the A and F states are separated by any of the B, C, D, and E states. However, in this example none of the states in the second group are separated by a state in the first group. Further examples of forming sub-groups when there are eight data states will be discussed below.

Another example of the first sub-group could be (Er, B, D, F) and the second sub-group could be (A, C, E, G). In this case, there are no adjacent data states in either the first sub-group or in the second sub-group. Also, all of the data states are in either the first sub-group or in the second sub-group.

In step 1010, a determination is made whether the difference between the number of storage elements in the first and second sub-groups is greater than a threshold. In one embodiment this includes tracking a running total of the difference between the number of storage elements in the first sub-group and the number of storage elements in the second sub-group. If the running total exceeds a threshold, then tracking the running total can stop without comparing remaining storage elements in the two groups. This tracking can be performed by logical circuitry on the memory die 512.

If it is determined in step 1012 that the difference is greater than a threshold, this indicates that there was a defect associated with programming the data. Step 1014 indicates that this determination is made. In one embodiment, this determination is made by logic on the memory chip 512, although the determination could be made off chip. This defect can be reported to, for example, the controller 544. The controller 544 is off the memory chip, in one embodiment. Reporting the defect does not require that the exact defect is specified.

Step 1016 determines whether additional sub-groups should be formed. Thus, the process 1000 can perform multiple passes. The next pass, two different sub-groups are formed at step 1008. In some embodiments, one or more additional sensing operations are performed to collect data to form the next sub-groups. That is, the storage elements can be sensed at one or more read reference levels. However, previous sensing results can be used, as well. In one embodiment, the next two sub-groups are formed based on a combination of previous sensing results and new sensing results.

Process 1000 is able to detect defects including, but not limited to, broken word lines, control to substrate shorts, word line to word line shorts, double writes. The process may use fewer sensing operations that some conventional techniques. The process can detect some defects that conventional techniques may miss. For example, some conventional techniques may miss a weak control gate to substrate short or a double write.

Note that process 1000 provides a very efficient way to test for defects. Since all of the memory cells can be placed in one sub-group or the other, this permits all states (as well as all memory cells) to be tested with a single comparison. Also, the comparison itself is very efficient, as it can be performed by taking a running total of the imbalance between the first sub-group and the second sub-group. Note that it is not required that a determination is made as to exactly how many memory cells are in a given state. It is not even required to determine exactly how many memory cells are in either sub-group. Note that such determinations might be difficult to make on the memory chip itself. For example, the logic circuitry would need the capability to count up to very high numbers. Also, making such counts could be time consuming, especially if made off chip.

Figure 11:
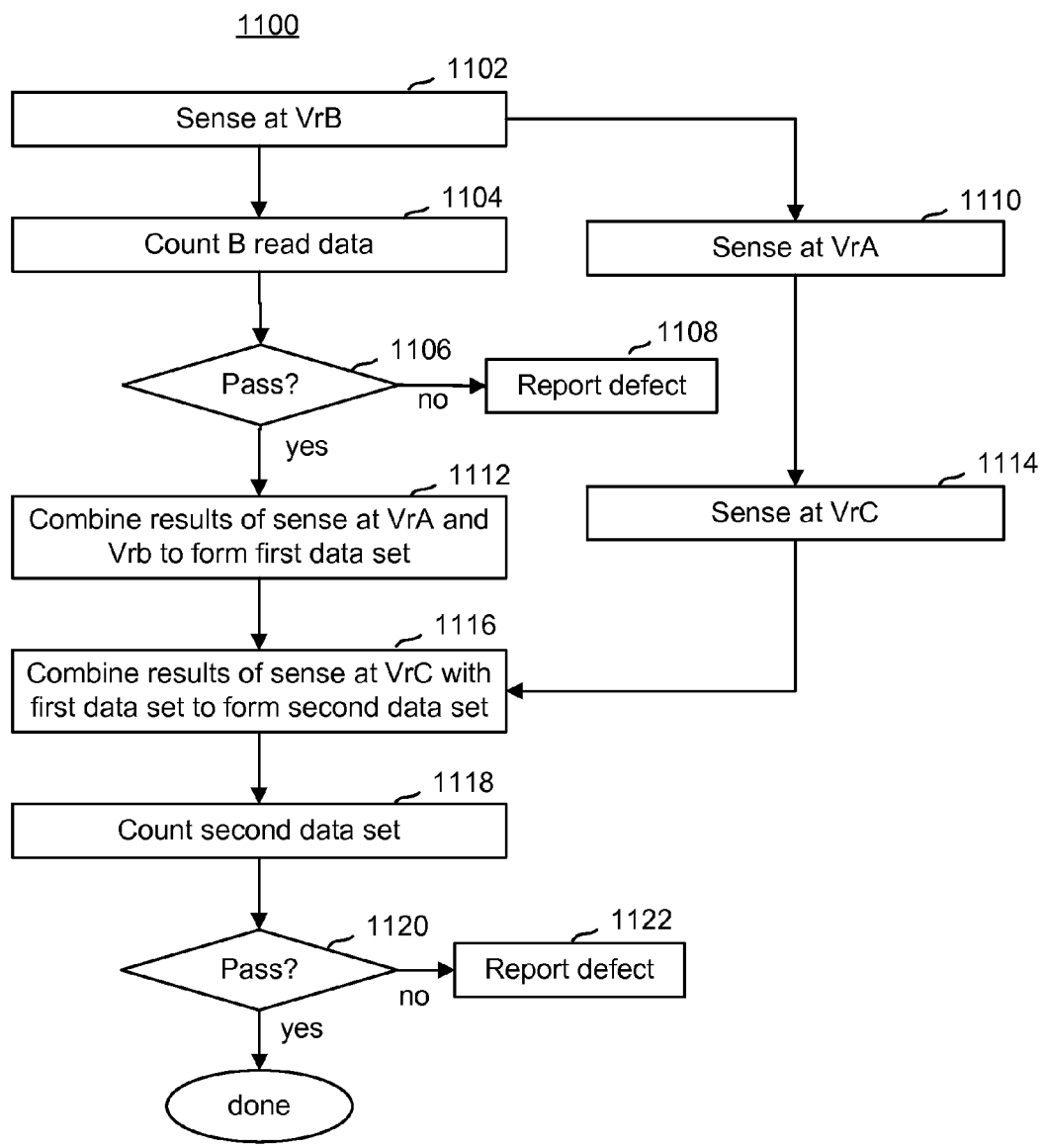
FIG. 11 is a flowchart of one embodiment of a process determining whether there was a defect when programming non-volatile storage elements.

FIG. 11 is a flowchart of one embodiment of a process 1100 determining whether there was a defect when programming non-volatile storage elements. This embodiment involves a case in which there are four data states. Process 1100 is one embodiment of steps 1006-1014 of process 1000. Thus, process 1100 may be performed after the data has been programmed into the storage elements. FIGS. 12A-12D represents usage of data latches associated with one of the storage elements during process 1100, and will be referred to throughout the discussion.

In step 1102, the storage elements are sensed at VrB. This is a read reference level that is intended to determine whether the Vt of the storage elements is at least as high as the B-state. Sensing at this level will result in a data latch associated with a given storage element as storing either a "1" or a "0", depending on the apparent Vt of the storage element. That is, either a "1" or "0" is stored, depending on whether the storage element conducts a current in response to VrB applied to the selected word line. A defect in the word line might result in the sensing operation failing to detect the actual Vt of a given storage element. Also, a defect in the word line might result in a storage element failing to reach its intended Vt.

Figure 12A:
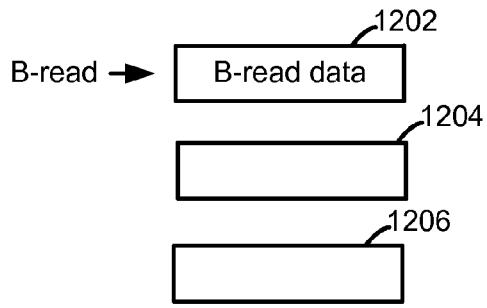
FIGS. 12A-12D represents usage of data latches associated with one of the storage elements during process of FIG. 11.

FIG. 12A represents results from sensing a storage element being stored into a data latch. Three data latches 1202, 1204, 1206 are shown in FIG. 12A. These data latches could be part of the sense block 300. It is not critical which three data latches are used. In one embodiment, bitline latch 682 can be used to initially store the results of sensing at VrB. This result may then be transferred to another latch, such that it is preserved when bitline latch 682 is used for later sensing steps.

Figure 13:
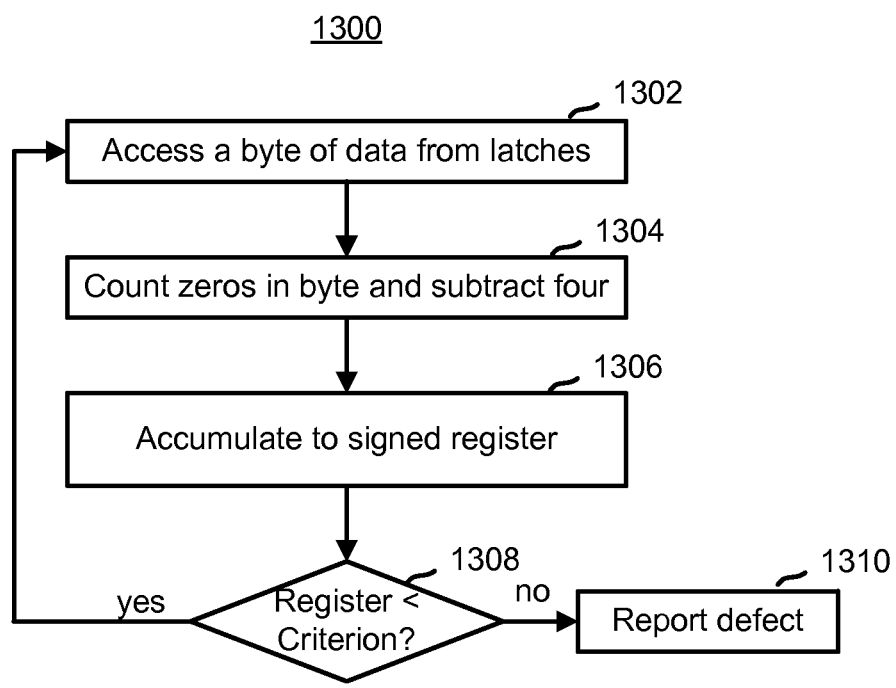
FIG. 13 is a flowchart of one embodiment of a process of counting data during a defect determining process.

In step 1104, the results from the sensing at step 1102 are processed (e.g., counted). In one embodiment, step 1104 accesses the results stored in the aforementioned data latches and compares the number of "1s" versus the number of "0s". A running total of the difference is kept in one embodiment. If the number of "1s" exceeds the number of "0s" by a threshold, this is noted. Likewise, if the number of "0s" exceeds the number of "1s" by a threshold, this is noted. The system could work its way down the word line, accessing the B-read data associated with each storage element, and keep a running total of whether there are more "1s" or more "0s". FIG. 13, to be discussed later, describes one embodiment for counting.

Step 1106 is a determination whether the processing of step 1104 detects a defect. A defect is detected if the threshold is exceeded. If so, then the fact that a defect is detected may be reported in step 1108 to, for example, controller 544. If a defect is detected, one option is to conclude the process. However, processing could continue.

Figure 12B:
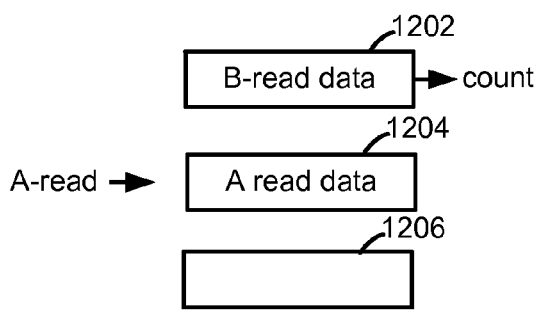

Step 1110 is to sense the storage elements at VrA. Note that step 1110 may begin after sensing at Vrb (step 1102), but prior to completion of processing the results of the Vrb read (step 1104). The timing is not critical, but starting the read (or sense) at VrA earlier helps speed up the defect detection process. FIG. 12B represents the counting of the B-state data and the storing of the sensing at Vra. A variety of techniques can be used to count the B-state data. Each storage element has one bit of B-read data.

Step 1112 is combining the results of sensing at VrA with the results of sensing at VrB. In one embodiment, an exclusive OR is performed between the VrA data and the VrB data. Step 1112 forms a first data set. This first data set contains 1 bit for each of the storage elements, in one embodiment. This step determines which storage elements that appear to be in the A-state, according to the sense operation. In one embodiment, storage elements that appear to be in the A-state will have a "1" and all other storage elements will have a "0".

Figure 12C:
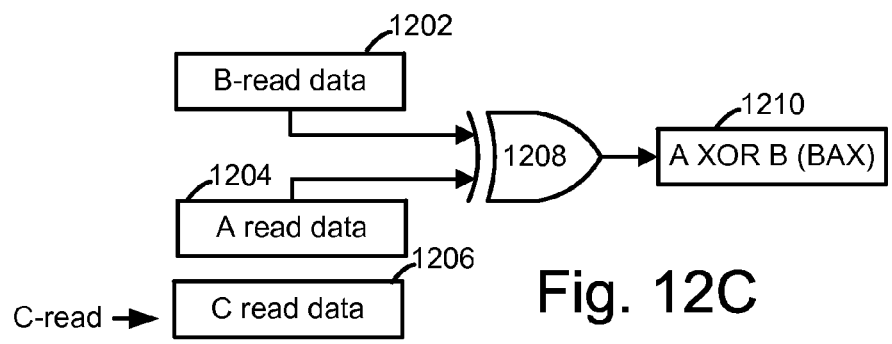

Step 1114 is to sense the storage elements at VrC. Note that step 1114 may begin after reading at VrA (step 1110), but prior to completion of step 1112. The timing is not critical, but starting the read at VrC earlier helps speed up the defect detection process. FIG. 12C represents storing of the sensing at VrC while combining the results of sensing at VrA and VrB. As depicted, the XOR is performed of the bit of A-read data with the bit of B-read data (using logic 1208) and stored as BAX. A separate latch 1210 is depicted for storing BAX. However, latches might be saved by storing BAX into either the latch that stores the B-read data or the latch that stores the A-read data.

Step 1116 is combining the results of sensing at VrC with the first data set to form a second data set. In one embodiment, an exclusive OR is performed between the VrC data and the first data set. This step forms two sub-groups of storage elements. One subgroup is (Er, B); the other sib-group is (A, C). In one embodiment, storage elements that according to the sense operation appear to be in either the Er- or B-state will have a "1" and storage elements that appear to be in either the A- or C-state will have a "0".

Figure 12D:
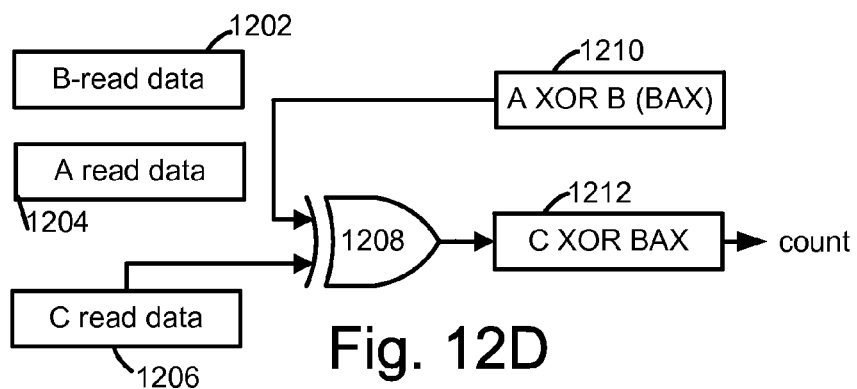

FIG. 12D represents step 1116. As depicted, an XOR is performed of the bit of C-read data with the bit of BAX (which is one bit of the aforementioned "first data set"). A separate latch 1212 is depicted for storing the results, for ease of illustration. However, latches might be saved by storing the results into a latch that contains data that is no longer needed. The results (C XOR BAX) for all of the storage elements are referred to as a "second data set."

Step 1118 is to process the results of step 1116. In one embodiment, step 1118 accesses the C XOR BAX results for each storage element, and compares the number of "1s" versus the number of "0s". A running total of the difference is kept, in one embodiment. If the number of "1s" exceeds the number of "0s" by a threshold, this is noted. Likewise, if the number of "0s" exceeds the number of "1s" by a threshold, this is noted. The system could work its way down the word line, accessing the C XOR BAX results associated with each storage element, and keep a running total of whether there are more "1s" or more "0s". FIG. 13, to be discussed later, describes one embodiment for counting.

Step 1120 is a decision box for determining whether the counting of step 1118 crossed a threshold, and hence whether a defect was detected. The process either reports a defect (step 1122) or concludes without reporting a defect (optionally, the fact that no defect occurred may be reported).

FIG. 13 is a flowchart of one embodiment of a process 1300 of counting data during a defect determining process. This might be used during step 1010, step 1104 and/or step 1118, for example. Process 1300 may be performed in part by the counting logic 503, depicted in FIG. 5.

In step 1302, a byte of data is accessed from latches associated with the storage elements that were just programmed. This could be accessing B-read data from eight storage elements. FIG. 12B shows accessing B-read data from one storage element for the count. This could be accessing C XOR BAX data from eight storage elements. FIG. 12D shows accessing C XOR BAX data from one storage element for the count. Note that there exist many other possibilities of what data is accessed. Thus, these examples should be considered to be representative of just two of the many possibilities.

Step 1304 is to count the zeros in the byte and subtract four. Step 1306 is to store the result of step 1304 in a signed accumulation register 501. In effect, the signed register 501 contains a result that is positive or negative, depending on whether there are more "1s" or "0s".

In step 1308, a determination is made whether the count in the signed accumulation register 501 exceeds a threshold that is associated with a defect of the programming process. Since this accumulation register 501 may be a signed register, "exceeding a threshold," as the term is used herein, means that either the positive value in the register 501 is greater than a positive threshold or the negative value in the register 501 is less than a negative threshold. The positive and negative thresholds may be the same in absolute value, but could be different in absolute value. In one embodiment, it does not matter whether "1s" exceed "0s" or whether "0s" exceed "1s". However, a different threshold could be used for when "1s" exceed "0s" than when "0s" exceed "1s".

If the threshold is exceeded, then a defect is reported in step 1310. The process 1300 may then conclude. Thus, it is not necessary to examine the results of additional storage elements once the threshold is exceeded. Otherwise, the process returns to step 1302 to access another byte of data from eight different storage elements.

Figure 14A:
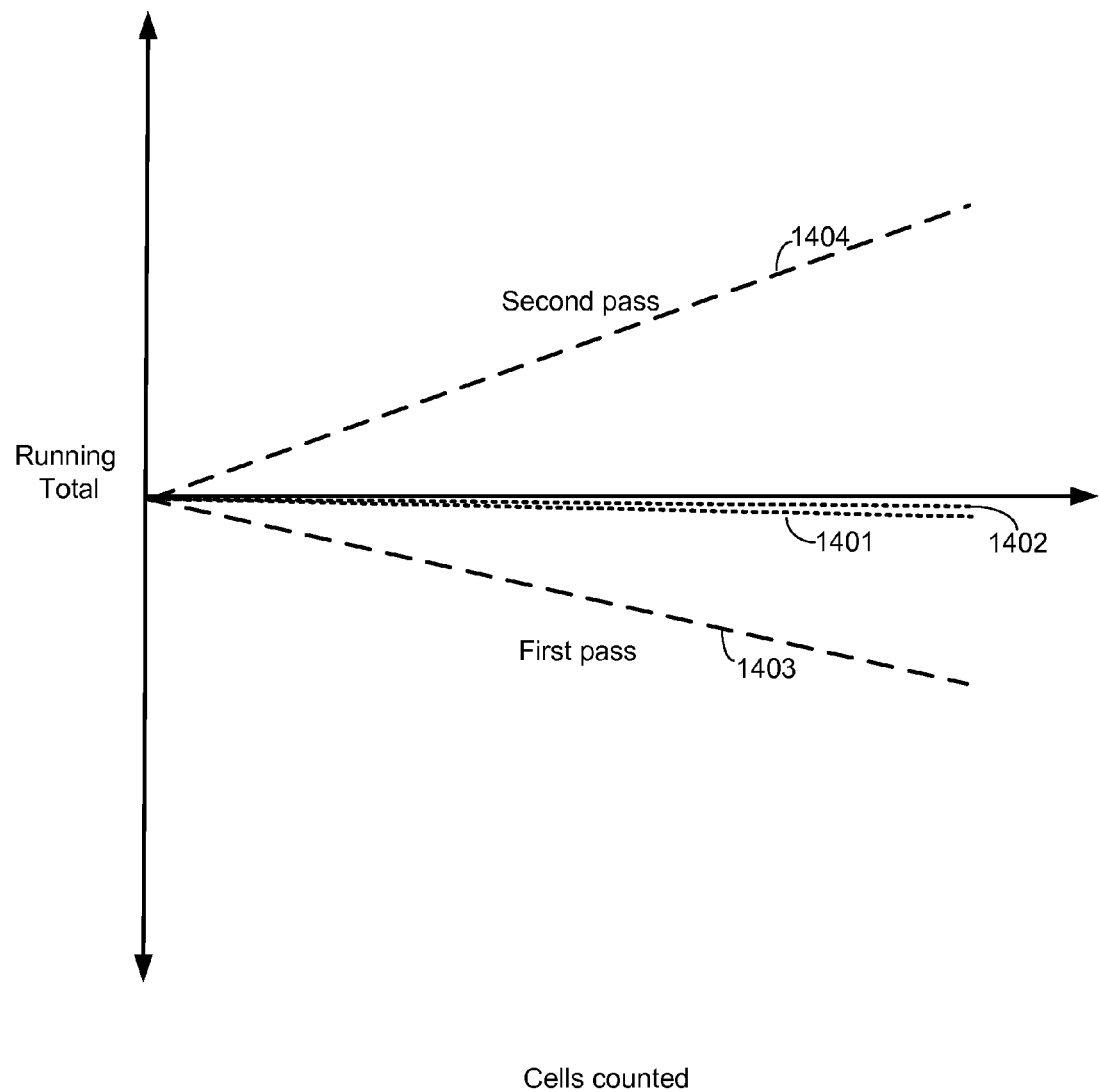
FIGS. 14A and 14B depict examples of how the number of "1s" and "0s" can diverge as more memory cells are considered in a process that detects defects.

FIG. 14A depicts an example of how the number of "1s" and "0s" can diverge as more memory cells are considered in a process that detects defects. The diagram depicts a running total for four different situations. Curves 1401 and 1402 are for a word line that has no detected defects. Curves 1403 and 1404 are for a word ling which had a detected defect. Curves 1401 and 1403 are for a first pass, such as counting the B-read data in step 1104. Curves 1402 and 1404 are for a second pass, such as counting the data in step 1118.

The y-axis represents a running total of whether there are more "1s" or "0s." For example, a positive y-axis value means there are more "1s". Conversely, a negative y-axis value means there are more "0s". The x-axis represents the memory cells that are counted.

There may be a small divergence from an exact equivalence of "1s" and "0s" for the normal word line. Thus, curves 1401 and 1402 may deviate slightly from zero. In this example both are depicted as drifting slightly below zero. However, they might drift slightly above zero, or oscillate between going above and below zero. Significantly, the deviation from zero is not more than a threshold value. Thus, the running total should never exceed a threshold amount for a word line that does not have a defect.

However, curve 1403 and 1404 each deviate significantly from zero, indicating a defect with the word line. In this example, both the first pass and the second pass deviate from zero. For some cases, one of the passes might not deviate from zero. For example, it might be that the first pass does not deviate significantly from zero, but that the second pass does. In this example, the first pass 1403 deviates below zero and the second pass 1404 deviates above zero. However, both passes might deviate in the same direction.

Various processes described herein state that a threshold value is used to determine whether there is a programming defect (with respect to counting "1s" and "0s"). A suitable threshold value can be determined empirically by studying defects in actual memory devices. The threshold can be determined in another manner. For example, the threshold could be determined based on an expected impact that a certain defect will have on the count. As one specific example, a broken word line may be expected to have a certain physical impact on the word line, which can be analyzed to determine an expected effect on the count of 1s" and "0s". However, note that the curve for a given defect will not always be the same. For example, with a broken word line, the location of the broken word line might affect the nature of the curve.

Also note that the curves for different types of defects might have a different shape and/or slope. For example, the curve for a broken word line might typically be different in shape and/or slope than the curve for a word line to word line short. The threshold values for different defects might, at least in principle, be different. A suitable threshold can be selected that is designed to detect a set of one or more types of defects. It is not required to discriminate between what type of defect is detected. Thus, the threshold can be set low enough to detect all types of defects in the set.

Figure 14B:
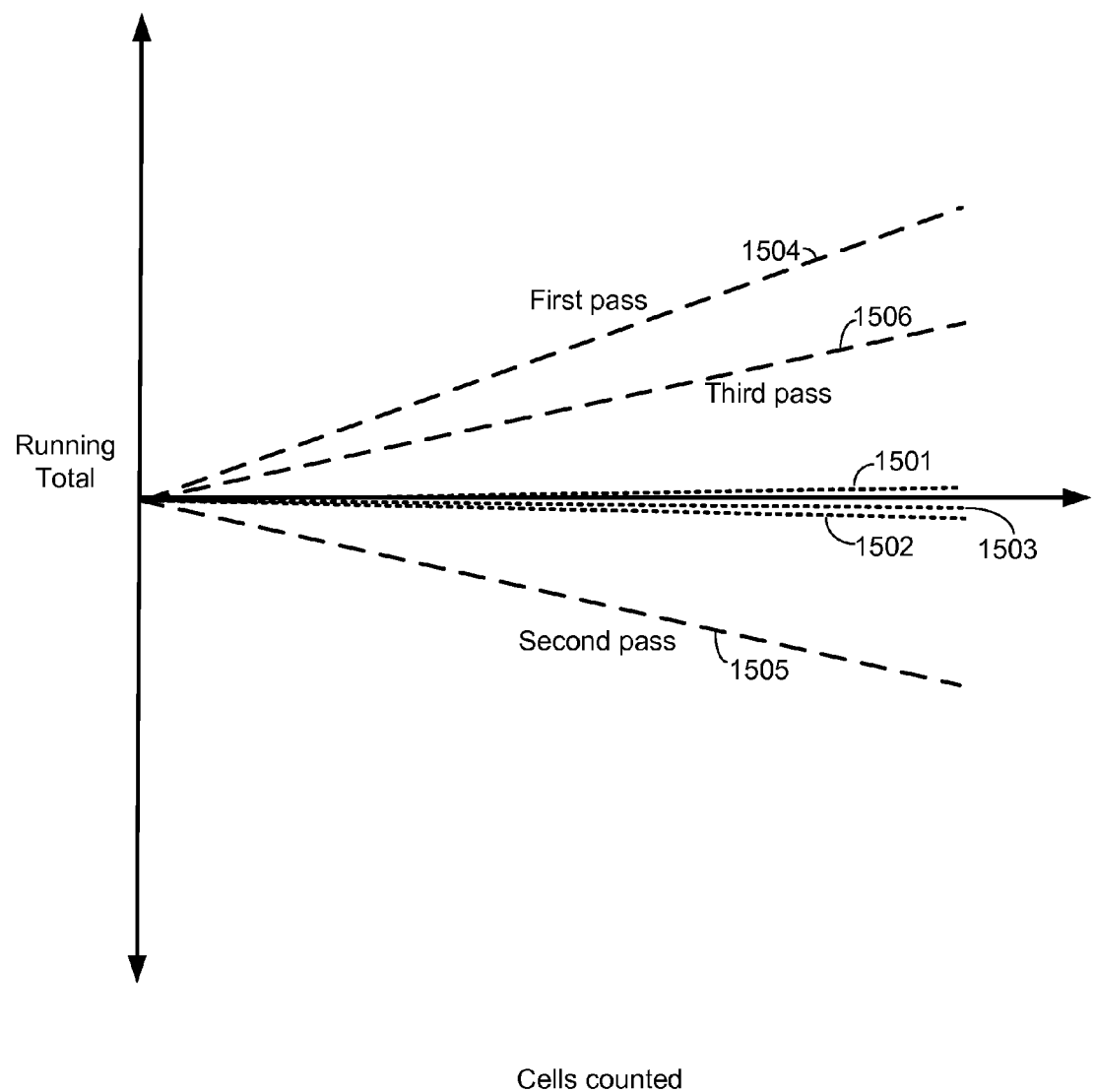

FIG. 14B depicts an example of how the number of "1s" and "0s" can diverge as more memory cells are considered in a process that detects defects when programming three bits per memory cell. The graph is similar to the one of FIG. 14C. In this case, a difference is that three passes are used. Curves 1501-1503 are three passes for a word line without a defect. Curves 1504-1506 are three passes for a word line with a defect. The curves are exemplary. The following example will clarify how three passes may be used.

Figure 15:
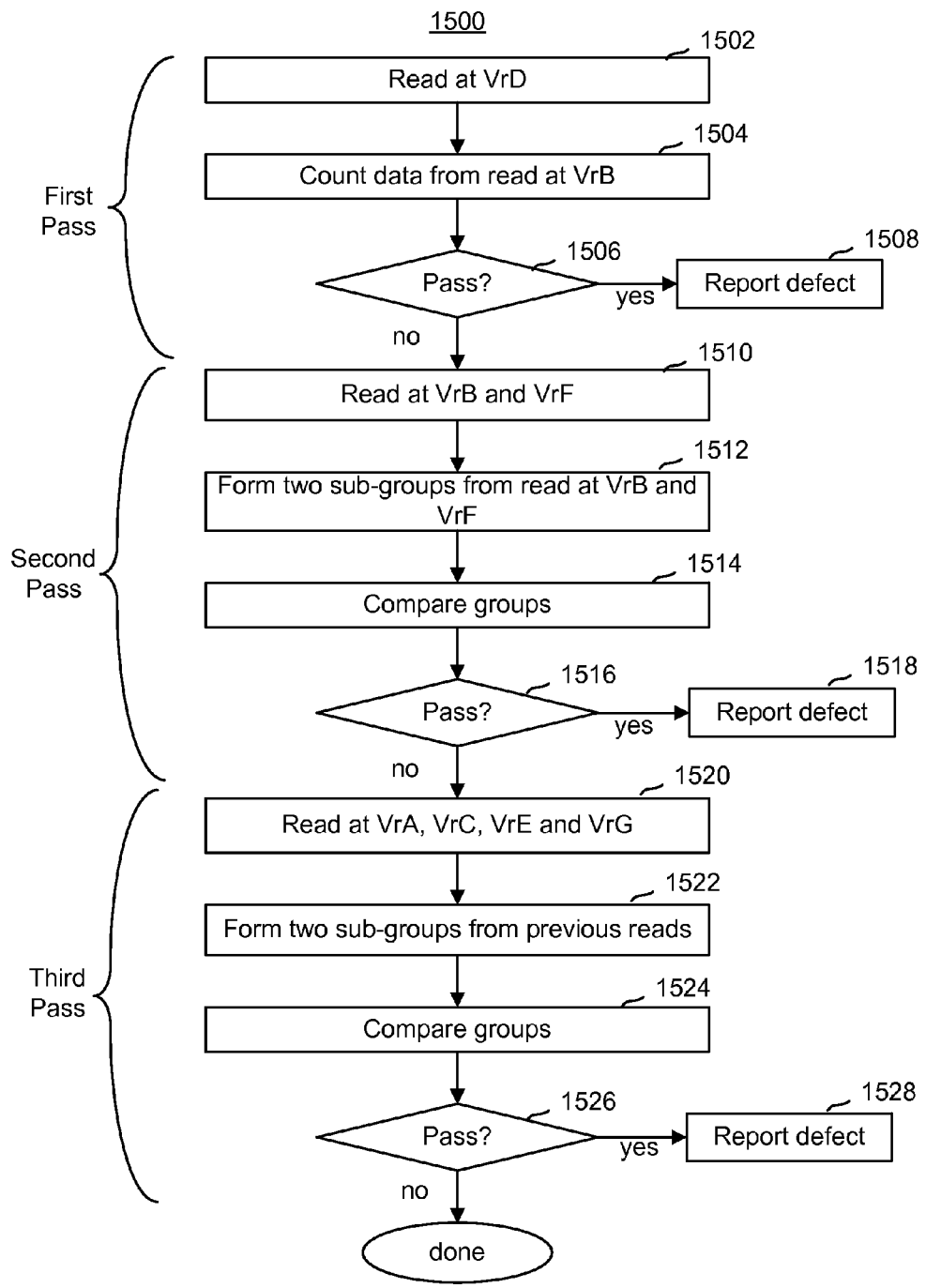
FIG. 15 is a flowchart of one embodiment of a process of detecting a programming defect when three bits are programmed per memory cell.

FIG. 15 is a flowchart of one embodiment of a process 1500 of detecting a programming defect when three bits are programmed per memory cell. Process 1500 is one embodiment of process 1000. The process 1500 has three "passes," each of which can generate a pass/fail response. However, the process 1500 can be modified to skip one or more of the passes. The process 1500 begins after programming data into the memory cells. Note that programming can conclude with either a pass or fail status. The process 1500 will refer to the example threshold distributions and reference levels of FIG. 7C, for illustration.

In step 1502, the memory cells are sensed at VrD. This sensing operation includes applying VrD to the selected word line and sensing the memory cells in response (e.g., determining whether the memory cells conduct a current), in one embodiment. Other sensing operations in process 1500 may be performed in a similar manner.

Results for each memory cell may be stored in a latch in, for example, sense block 300. In step 1504, the data from step 1502 is processed to determine whether there is a defect with programming. Step 1504 may be similar to step 1104 of FIG. 11, in which the data from the read at VrB was processed for the two-bit per memory cell example. Thus, step 1504 may compare the "1s" with the "0s" to determine whether one exceeds the other by more than a pre-determined amount. A running total may be kept. Referring back to FIG. 14B, the graph depicts how the running total for a defective word line (or other programming defect such as a double write) may increase as more memory cells are counted. The threshold may be selected such that eventually the running total for a defective word line exceeds the threshold, but the running total for a normal (no defect) word line does not exceed the threshold. Step 1506 is a determination whether a defect was found. If so, then a defect is reported to, for example, the controller 544, in step 1508. Note that steps 1506 and 1508 are optional.

Step 1510 is to sense the memory cells are levels VrB and VrF. These are typically performed as two separate sensing operations. Results of these sensing operations may be stored in a latch, which may be located in the sense block 300.

In step 1512, two sub-groups are formed from the sensing operations of step 1512. One sub-group may be (Er, A, F, G), the other sub-group (C, D, E, F). In one embodiment, memory cells placed into one group are assigned a "1", and memory cells placed into the other group are assigned a "0." Note that in this example, the first sub-group includes data states that are separated by a data state in the other sub-group. Referring to FIG. 7C, states C, D, E, and F separate some of the data states in the other sub-group. It is possible that some defects could be masked otherwise without this separation.

The sensing step 1512 provided two bits of information for each memory cell (one for each read). These two bits may be processed to place the memory cell into the appropriate group. In other words, the results of the VrB read and the VrF read may be processed to form the sub-groups. Techniques such as described in connection with FIG. 11 and FIG. 12A-12D may be used. For example, various logical operations such as XOR, OR, AND, NAND, NOT, etc., may be used on the results of the VrB read and the VrF read.

Step 1514 is to compare the two sub-groups to determine whether the number of memory cells in one group exceeds the number in the other group by more than a pre-determined amount that is associated with a programming defect. Step 1514 includes tracking a running total of the difference in the number of "1s" and "0s", where the 1s" and "0s" correspond to the sub-groups. Step 1514 may be performed in a similar manner as process 1300 used the accumulation register.

Step 1516 is a determination of whether the comparison of step 1514 resulted in the threshold being exceeded. If so, a defect is reported in step 1518. Otherwise, the process continues to step 1520.

In step 1520, the memory cells are sensed at VrA, VrC, VrE, and VrG. The results of each sensing operation may be stored in a latch in, for example, sense block 300. Thus, this step may record a "1" or a "0" for each of these sense operations.

Step 1522 is to form two sub-groups from previous reads. In one embodiment, step 1522 uses results from all seven read operations (e.g., VrA-VrG). An example of the sub-grouping is (Er, B, D, F) and (A, C, E, G). In this example, each of the sub-groups includes two data states that are separated by a data state in the other sub-group. Stated another way, the data states alternate between the two sub-groups. Forming groups such that there is this separation of data states helps to better detect defects. It is possible that some defects could be masked otherwise. Techniques such as described in connection with FIG. 11 and FIG. 12A-12D may be used to form the sub-groups. For example, various logical operations such as XOR, OR, AND, NAND, etc., may be used on the results of all seven sensing operations (VrA-VrG).

Step 1524 is to compare the two sub-groups to determine whether the number of memory cells in one group exceeds the number in the other group by more than a pre-determined amount that is associated with a word line defect. Step 1524 includes tracking a running total of the difference in the number of "1s" and "0s", where the 1s" and "0s" correspond to the sub-groups formed in step 1522. Step 1524 may be performed in a similar manner as process 1300 used the accumulation register.

Step 1526 is a determination of whether the comparison of step 1524 resulted in the threshold being exceeded. If so, a defect is reported in step 1528. Otherwise, the process concludes. If no defects were detected, this may optionally be reported.

The sub-groups that are formed could be different than described in process 1500. Another example is to form different sub-groups at step 1522. The sub-groups could be (Er, C, D, G) and (A, B, E, F), as another example. Note that forming these sub-groups does not require sensing at all seven read reference levels. Thus, some of the sensing operations could be skipped, if it is not desired to perform some of the other defect determinations shown in process 1500. Techniques such as described in connection with FIG. 11 and FIG. 12A-12D may be used to form the sub-groups. For example, various logical operations such as XOR, OR, AND, NAND, etc., may be used on the results of all seven sensing operations (VrA-VrG). After forming sub-groups (Er, C, D, G) and (A, B, E, F), they may be compared in a similar manner as discussed in steps 1524-1528. One option is to form sub-groups (Er, C, D, G) and (A, B, E, F) instead of (Er, B, D, F) and (A, C, E, G). Another option is to form and analyze both.

Figure 16:
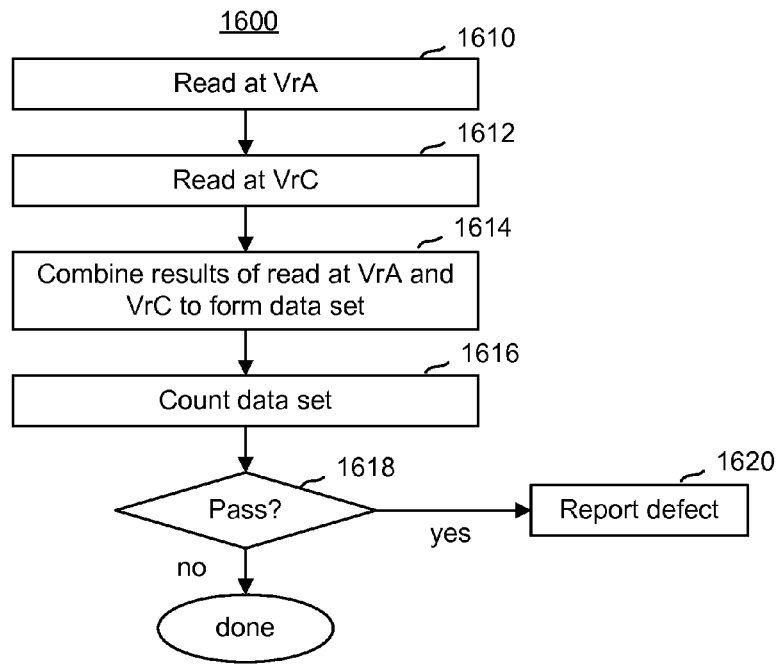
FIG. 16 is a flowchart of one embodiment of a process of detecting a programming defect when two bits are programmed per memory cell.

FIG. 16 is a flowchart of one embodiment of a process 1600 of detecting a programming defect when two bits are programmed per memory cell. This process 1600 has some similarities to process 1100, but forms different sub-groups. Optionally, process 1600 can begin with a read at read reference level VrB, but this is not required. Thus, steps such as 1102-1108 could be optionally performed at the beginning.

At step 1610 a read at read reference level VrA is performed. These results may be stored in a latch in, for example, sense block 300. At step 1612 a read at read reference level VrC is performed. These results may be stored in a latch in, for example, sense block 300.

In step 1614, the results of these two sensing operations are combined to form two sub-groups of memory cells. These sub-groups may be (Er, C) and (A, B). These groups may be formed by performing various logical operations such as XOR, OR, AND, NAND, etc., on the results stored in the latches.

In step 1616, the sub-groups are compared to determine whether the number of memory cells in one group exceeds the number in the other group by more than a pre-determined amount that is associated with a word line defect. Step 1616 includes tracking a running total of the difference in the number of "1s" and "0s", where the 1s" and "0s" correspond to the sub-groups formed in step 1614. Step 1616 may be performed in a similar manner as process 1300 used the accumulation register.

Step 1618 is a determination of whether the comparison of step 1616 resulted in the threshold being exceeded. If so, a defect is reported in step 1620. Otherwise, the process concludes. If no defects were detected, this may optionally be reported.

Figure 17:
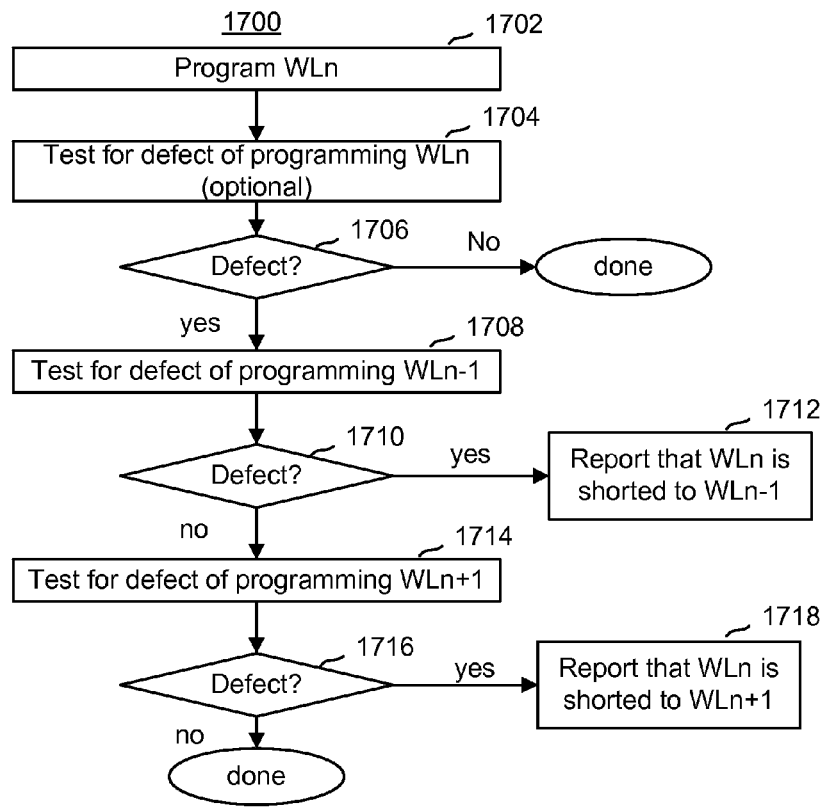
FIG. 17 is a flowchart of one embodiment of a process 1700 of determining that two word lines are shorted together.

Numerous types of defects can be determined by techniques described herein. Examples include, but are not limited to, broken word line, control gate to substrate short, word line to word line short, or a double write. A double write is a condition in which memory cells that have not been erased are written to again. As noted above, the exact defect does not need to be reported. However, in some cases the type of defect can be reported. FIG. 17 is a flowchart of one embodiment of a process 1700 of determining that two word lines are shorted together. This technique quickly makes this determination and can be performed on the memory chip 512. Thus, the controller 544 does not need to perform special operations to determine which two word lines are shorted together.

In step 1702, WLn is programmed. In optional step 1704, WLn is tested for a defect. Any of the techniques described herein can be used to test for the defect. If there is not a defect (step 1706=no), then the process concludes. In one embodiment, rather the testing for a defect, it is simply determined that programming of WLn ended with a status of failure. For example, process 700 ended with step 730 of "status=fail."

If there is a defect or if programming of WLn ended with status=fail, then WLn−1 and WLn+1 are tested for a defect. Any of the techniques described herein can be used to test for the defect. For the sake of discussion, it is assumed that WLn−1 and WLn+1 are already programmed. If not, the test for a short can be put off until the respective word line is programmed. Of course, WLn can be tested using techniques described herein without WLn+1 being programmed.

In step 1708, WLn−1 is tested for a defect, using any of the techniques disclosed herein. If a defect is detected (step 1710=yes), then it is reported that WLn is shorted to WLn−1, in step 1712. The process can then conclude. Otherwise, the process continues on to step 1714.

In step 1714, WLn+1 is tested for a defect, using any of the techniques disclosed herein. If a defect is detected (step 1716=yes), then it is reported that WLn is shorted to WLn+1, in step 1718. The process then concludes. If no defect was detected with either WLn−1 or WLn+1, then it is determined that there is not a WL to WL short involving WLn.

One embodiment disclosed herein includes a method of determining whether there is a defect associated with programming data into a group of non-volatile storage elements. The method includes programming data into a group of non-volatile storage elements that, if successful, results in a substantially even distribution of the non-volatile storage elements in a plurality of data states. The group is sensed at one or more different reference levels that each separate two adjacent data states. A first sub-group of the non-volatile storage elements and a second sub-group of the non-volatile storage elements are formed based on the sensing. A running total of the difference in the number of non-volatile storage elements in the first group and the second group is tracked. The tracking is performed by logical circuitry on the memory die. A determination is made that there is a defect associated with programming the data into the group in response to determining that the difference is larger than a threshold.

One embodiment disclosed herein includes a non-volatile memory device comprising a plurality of non-volatile storage elements, a plurality of word lines associated with the non-volatile storage elements, and one or more managing circuits in communication with the plurality of word lines and the plurality of non-volatile storage elements. The one or more managing circuits program data into non-volatile storage elements associated with a selected word line. The data is programmed such that, if successful, results in substantially equal populations of the non-volatile storage elements in each of a plurality of data states. The one or more managing circuits sense the non-volatile storage elements associated with the selected word line at one or more different reference levels that each separate two adjacent data states. The one or more managing circuits form a first sub-group of the non-volatile storage elements associated with the selected word line and a second sub-group of the non-volatile storage elements associated with the selected word line based on the data state that a given storage element appears to be in based on a range of one or more data states that a given storage element appears to be in based on the sensing. Logic on the memory die tracks a running total of the difference in the number of non-volatile storage elements in the first group and the second group. The one or more managing circuits determine that there is a defect associated with programming the data in response to determining that the difference is larger than a threshold.

One embodiment disclosed a method for detecting whether there is a defect associated with programming randomized data into a group of non-volatile storage elements. The method includes randomizing data and programming the randomized data into a group of non-volatile storage elements that are associated with a selected word line. The group is programmed to a plurality of data states. Three different read reference levels are applied to the selected word line. Each of the read reference levels separates two adjacent data states. A determination is made whether the respective non-volatile storage elements in the group conduct a current in response to applying each of the three different read reference levels. A first sub-group of the non-volatile storage elements associated with the selected word line and a second sub-group of the non-volatile storage elements associated with the selected word line are formed based on which one or more of the data states a given non-volatile storage element appears to be in based on the reading. All of the data states are represented in either the first sub-group or in the second sub-group. There are no adjacent data states represented in either the first sub-group or in the second sub-group. A determination is made whether a difference between the number of storage elements in the first sub-group and the second sub-group is larger than a threshold. It is detected whether there is a defect associated with the programming the randomized data into the group based on whether the difference is greater than the threshold.

One embodiment includes a non-volatile memory device, comprising a plurality of non-volatile storage elements, a plurality of word lines associated with the non-volatile storage elements, and one or more managing circuits in communication with the plurality of word lines and the plurality of non-volatile storage elements. The one or more managing circuits randomize data. The one or more managing circuits program the randomized data into a group of the non-volatile storage elements that are associated with a selected word line. The one or more managing circuits apply three different read reference levels to the selected word line after programming the data into the group. The three different read reference levels each separate two adjacent data states. The one or more managing circuits determine whether the respective non-volatile storage elements in the group conduct a current in response to applying each of the three different read reference levels. The one or more managing circuits form a first sub-group of the non-volatile storage elements associated with the selected word line and a second sub-group of the non-volatile storage elements associated with the selected word line based on whether currents were conducted. All of the data states are in either the first sub-group or in the second sub-group. There are no adjacent data states in either the first sub-group or in the second sub-group. The one or more managing circuits determine whether a difference between the number of storage elements in the first sub-group and the second sub-group is larger than a threshold. The one or more managing circuits determine whether there is a defect associated with programming the data based on whether the difference is larger than the threshold.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method comprising:
    programming data into a group of non-volatile storage elements associated with a selected word line, the group of non-volatile storage elements are on a memory die, the programming, if successful, results in a substantially even distribution of the non-volatile storage elements in a plurality of data states;
    sensing the group of non-volatile storage elements at one or more different reference levels that each separate two adjacent data states after programming the data into the group;
    forming a first sub-group of the non-volatile storage elements and a second sub-group of the non-volatile storage elements based on the sensing;
    tracking a running total of the difference in the number of non-volatile storage elements in the first group and the second group, the tracking is performed by logical circuitry on the memory die; and
    determining that there is a defect associated with programming the data into the group of non-volatile storage elements in response to determining that the difference is larger than a threshold.

2. The method of claim 1, wherein:
    each sub-group includes at least two of the data states, at least one of the first sub-group or the second sub-group includes two data states that are separated by a data state in the other sub-group.

3. The method of claim 2, wherein there are no adjacent data states in either the first sub-group or in the second sub-group, wherein all of the plurality of data states are in either the first sub-group or in the second sub-group.

4. The method of claim 2, wherein there are adjacent data states in either the first sub-group or in the second sub-group, wherein all of the plurality of data states are in either the first sub-group or in the second sub-group.

5. The method of claim 1, further comprising:
    forming a third sub-group of the non-volatile storage elements and a fourth sub-group of the non-volatile storage elements based on the sensing the group at a plurality of different reference levels, the third and fourth sub-groups each include at least two data states, at least one of the third sub-group or the fourth sub-group include two data states that are separated by a data state in the other of the third or fourth sub-group;
    determining whether a difference between the number of storage elements in the third sub-group and the fourth sub-group is larger than a second threshold; and
    determining that there is a defect associated with programming the data into the group of the non-volatile storage elements in response to determining that the difference is larger than the second threshold.

6. The method of claim 1, wherein the forming the first sub-group of the non-volatile storage elements and the second sub-group of the non-volatile storage elements based on the sensing includes combining results of sensing at a first reference level and a second reference level of the different reference levels, the combining the results is performed while sensing at a third reference level of the different reference levels.

7. The method of claim 1, wherein the defect includes one or more of a broken word line, control gate to substrate short, word line to word line short, or a double write.

8. The method of claim 1, wherein the group of non-volatile storage elements are associated with the same word line, further comprising:
  determining that the programming of a word line adjacent to the selected word line has a status of fail;
  determining that the selected word line and the adjacent word line are shorted together in response to the difference between the number of storage elements in the first sub-group and the number of storage elements in the second sub-group being larger than the threshold.

9. The method of claim 1, wherein the programming data into a group of non-volatile storage elements to that, if successful, results in a substantially even distribution of the non-volatile storage elements in a plurality of data states comprises:
  performing a random or a pseudo random scrambling of data to be programmed into the group.

10. The method of claim 1, wherein the tracking a running total of the difference in the number of non-volatile storage elements in the first group and the second group comprises:
  stopping the tracking of the running total in response to determining that the difference is greater than the threshold prior to comparing all storage elements in both sub-groups.

11. A non-volatile memory device, comprising:
  a plurality of non-volatile storage elements on a memory die;
  a plurality of word lines associated with the non-volatile storage elements; and
  one or more managing circuits in communication with the plurality of word lines and the plurality of non-volatile storage elements, the one or more managing circuits include logical circuitry on the memory die, the one or more managing circuits program data into a group of the non-volatile storage elements associated with a selected word line, the data is programmed such that, if successful, results in substantially equal populations of the non-volatile storage elements in each of a plurality of data states, the one or more managing circuits sense the non-volatile storage elements associated with the selected word line at one or more different reference levels that each separate two adjacent data states after programming the data into the group, the one or more managing circuits form a first sub-group of the non-volatile storage elements associated with the selected word line and a second sub-group of the non-volatile storage elements associated with the selected word line based on a range of one or more data states that a given storage element appears to be in based on the sensing, the logical circuitry tracks a running total of the difference in the number of non-volatile storage elements in the first group and the second group, the one or more managing circuits determine that there is a defect associated with programming the data in response to determining that the difference is larger than a threshold.

12. The non-volatile memory device of claim 11, wherein each of the sub-groups includes storage elements for at least two of the data states, at least one of the first sub-group or second sub-group includes storage elements for two data states that are separated by a data state in the other sub-group.

13. The non-volatile memory device of claim 12, wherein there are no storage elements having adjacent data states in either the first sub-group or in the second sub-group, wherein all of the plurality of data states are represented in either the first sub-group or in the second sub-group.

14. The non-volatile memory device of claim 12, wherein there are storage elements having adjacent data states in either the first sub-group or in the second sub-group, wherein all of the plurality of data states are represented in either the first sub-group or in the second sub-group.

15. The non-volatile memory device of claim 12, wherein the one or more managing circuits form a third sub-group of the non-volatile storage elements and a fourth sub-group of the non-volatile storage elements based on the sensing the group, the third and fourth sub-groups each include at least two data states, at least one of the third sub-group or the fourth sub-group include two data states that are separated by a data state in the other of the third or fourth sub-group, the one or more managing circuits determine whether a difference between the number of storage elements in the third sub-group and the fourth sub-group is larger than a second threshold, the one or more managing circuits determine that there is a defect associated with programming the data into the group in response to determining that the difference is larger than the second threshold.

16. The non-volatile memory device of claim 11, wherein the non-volatile storage elements are arranged as NAND strings.

17. A method comprising:
  randomizing data;
  programming the randomized data into a group of non-volatile storage elements that are associated with a selected word line, the group is programmed to a plurality of data states;
  applying three different read reference levels to the selected word line after programming is complete, each of the read reference levels separates two adjacent data states;
  determining whether the respective non-volatile storage elements in the group conduct a current in response to applying each of the three different read reference levels;
  forming a first sub-group of the non-volatile storage elements associated with the selected word line and a second sub-group of the non-volatile storage elements associated with the selected word line based on which one or more of the data states a given non-volatile storage element appears to be in based on whether a current was conducted, all of the data states are represented in either the first sub-group or in the second sub-group, there are no adjacent data states represented in either the first sub-group or in the second sub-group;
  determining whether a difference between the number of storage elements in the first sub-group and the second sub-group is larger than a threshold; and
  determining whether there is a defect associated with the programming the randomized data into the group based on whether the difference is greater than the threshold.

18. The method of claim 17, wherein the defect includes a defect of the selected word line.

19. The method of claim 17, wherein the defect includes a double programming of the selected word line.

20. A non-volatile memory device, comprising:
  a plurality of non-volatile storage elements;
  a plurality of word lines associated with the non-volatile storage elements; and
  one or more managing circuits in communication with the plurality of word lines and the plurality of non-volatile storage elements, the one or more managing circuits randomize data, the one or more managing circuits program the randomized data into a group of the non-volatile storage elements that are associated with a selected word line, the one or more managing circuits apply three different read reference levels to the selected word line after programming the data into the group, the three different read reference levels each separate two adjacent data states, the one or more managing circuits determine whether the respective non-volatile storage elements in the group conduct a current in response to applying each of the three different read reference levels, the one or more managing circuits form a first sub-group of the non-volatile storage elements associated with the selected word line and a second sub-group of the non-volatile storage elements associated with the selected word line based on whether currents were conducted, all of the data states are in either the first sub-group or in the second sub-group, there are no adjacent data states in either the first sub-group or in the second sub-group, the one or more managing circuits determine whether a difference between the number of storage elements in the first sub-group and the second sub-group is larger than a threshold, the one or more managing circuits determine whether there is a defect associated with programming the data based on whether the difference is larger than the threshold.

* * * * *